United States Patent
Yano et al.

(10) Patent No.: US 8,738,867 B2
(45) Date of Patent: *May 27, 2014

(54) MEMORY SYSTEM

(71) Applicant: Kabushiki Kaisha Toshiba, Minato-ku (JP)

(72) Inventors: Junji Yano, Kanagawa (JP); Hidenori Matsuzaki, Tokyo (JP); Kosuke Hatsuda, Tokyo (JP); Shigehiro Asano, Kanagawa (JP); Shinichi Kanno, Tokyo (JP); Toshikatsu Hida, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/855,394

(22) Filed: Apr. 2, 2013

(65) Prior Publication Data

US 2013/0290659 A1 Oct. 31, 2013

Related U.S. Application Data

(63) Continuation of application No. 12/529,227, filed as application No. PCT/JP2009/052590 on Feb. 10, 2009, now Pat. No. 8,438,343.

(30) Foreign Application Priority Data

Feb. 29, 2008 (JP) ................................. 2008-051267
Feb. 29, 2008 (JP) ................................. 2008-051378

(51) Int. Cl.
*G06F 12/06* (2006.01)
*G06F 12/16* (2006.01)

(52) U.S. Cl.
USPC ................... 711/154; 711/103; 711/E12.008

(58) Field of Classification Search
USPC .................................. 711/103, 154, E12.008
See application file for complete search history.

(56) References Cited

U.S. PATENT DOCUMENTS 5,327,551 A   7/1994  Kaneko
6,282,624 B1  8/2001  Kimura et al.
(Continued)

FOREIGN PATENT DOCUMENTS

| EP | 0 887 732 A1 | 12/1998 |
|----|---|---|
| EP | 0 977 121 A2 | 2/2000 |
| JP | 2003-280825 | 10/2003 |
| JP | 2006 285600 | 10/2006 |
| WO | WO 94/20906 | 9/1994 |

OTHER PUBLICATIONS

Office Action issued Aug. 12, 2013, in European Patent Application No. 10 197 364.2.

(Continued)

*Primary Examiner* — Hal Schnee
(74) *Attorney, Agent, or Firm* — Oblon, Spivak, McClelland, Maier & Neustadt, L.L.P.

(57) ABSTRACT

A memory system includes a volatile first storing unit, a nonvolatile second storing unit, and a controller. The controller performs data transfer, stores management information including a storage position of data stored in the second storing unit into the first storing unit, and performs data management while updating the management information. The second storing unit stores management information in a latest state and a storage position of the management information. The storage position information is read by the controller during a startup operation of the memory system and includes a second pointer indicating a storage position of the management information in a latest state and a first pointer indicating a storage position of the second pointer. The first pointer is stored in a fixed area in the second storing unit and the second pointer is stored in an area excluding the fixed area in the second storing unit.

18 Claims, 14 Drawing Sheets

(56) References Cited

U.S. PATENT DOCUMENTS

| | | |
|---|---|---|
| 6,377,500 B1 | 4/2002 | Fujimoto et al. |
| 6,591,328 B1 | 7/2003 | Iida et al. |
| 2006/0253645 A1 | 11/2006 | Lasser |
| 2006/0282644 A1 | 12/2006 | Wong |
| 2007/0124531 A1 | 5/2007 | Nishihara |
| 2008/0086588 A1 | 4/2008 | Danilak et al. |
| 2008/0091874 A1 | 4/2008 | Waltermann et al. |
| 2008/0104361 A1 | 5/2008 | Ippongi |
| 2009/0158085 A1 | 6/2009 | Kern et al. |

OTHER PUBLICATIONS

Combined Taiwanese Office Action and Search Report issued Apr. 12, 2013, in Patent Application No. 098105523 (with English-language translation and English Translation of Category of Cited Documents).

Extended Search Report issued Mar. 14, 2011 in European Patent Application No. 10197364.2-1229.

Notice of Rejection issued May 8, 2012 in Japanese Patent Application No. 2008-051267 (with English translation).

MEMORY SYSTEM

CROSS-REFERENCE TO RELATED APPLICATIONS

The present application is a continuation of U.S. application Ser. No. 12/529,227 filed on Apr. 8, 2010, which is based on PCT JP 2009/052590 filed on Feb. 10, 2009, and claims priority to JP 2008-051267 filed Feb. 29, 2008, and JP 2008-051378 filed on Feb. 29, 2008, the entire contents of each of which are incorporated herein by reference.

TECHNICAL FIELD

The present invention relates to a memory system employing a nonvolatile semiconductor storage device.

BACKGROUND ART

Some personal computers (PC) employ a hard disk device as a secondary storage device. In such PCs, a technology is known for backing up data that has been stored in the hard disk device to prevent the data from becoming invalid because of some failure. For example, when act of changing data in the hard disk device is detected, a snapshot as a backup copy of the data before the change is taken and a log of changes made to the data is generated. Then, processing for taking a new snapshot, invalidating a log taken in the past before the new snapshot was taken, and generating a new log is repeated at every predetermined time (see, for example, US Patent Application Publication No. 2006/0224636). In case data becomes invalid due to some reason, the data can be restored by referring to the snapshot and the log.

In recent years, a capacity of a NAND flash memory as a nonvolatile semiconductor storage device has been increased dramatically. As a result, personal computers including a memory system having the NAND flash memory as a secondary storage device have been put to practical use. However, the technology disclosed in US Patent Application Publication No. 2006/0224636 cannot be applied to backup of data stored in such a personal computer having the NAND flash memory as the secondary storage device as in the case of backup of data stored in the personal computer having the hard disk device as the secondary storage device. This is because a multi-value memory technology that can store a plurality of data (multi-value data) equal to or larger than 2 bits in one memory cell is employed to increase the capacity of the NAND flash memory.

A memory cell configuring a multi-value memory has a field effect transistor structure having a stacked gate structure in which a gate insulating film, a floating gate electrode, an inter-gate insulating film, and a control gate electrode are stacked in order on a channel region and a plurality of threshold voltages can be set according to the number of electrons accumulated in the floating gate electrode. In order to make it possible to perform multi-value storage based on the plurality of threshold voltages, the distribution of a threshold voltage corresponding to one data needs to be made extremely narrow.

For example, as a multi-value memory that can store four values, there is a multi-value memory that includes a lower order page and a higher order page in one memory cell and stores 2 bits (four values) by writing 1-bit data in the respective pages. In a method of writing data in such a multi-value memory, after data is written in a lower order page of a first memory cell, data is written in a lower order page of a memory cell (a second memory cell) that is adjacent to the first memory cell. After data is written in this adjacent memory cell, data is written in a higher order page of the first memory cell (see, for example, JP-A 2004-192789 (KOKAI)).

However, in such a multi-value memory, a threshold voltage of the first memory cell in which data has been written earlier fluctuates because of a threshold voltage of the second memory cell in which the data is written later and that is adjacent to the first memory cell. Therefore, in the multi-value memory, it is likely that lower order page breakage occurs in which, if writing is suspended because of, for example, abnormal isolation of a power supply while data is being written in a higher order page of a certain memory cell, data in a lower order page in which the data is written earlier is also broken.

In a memory system that includes the NAND flash memory, when data is stored, it is necessary to once erase a writing area in, for example, a unit called block and then perform writing in a unit called page. However, there is a problem that, as the number of times of erasing for a block performed prior to such writing of the data increases, deterioration in a memory cell configuring the block worsens. Therefore, in the personal computer having the NAND flash memory as the secondary storage device, it is necessary to perform data management for suppressing the number of times of erasing for the block. When the data is restored based on the snapshot and the log as explained above, it is also necessary to perform data management to suppress the number of times of erasing for the block. In particular, concerning storage of management information indicating a storage position of the data in the NAND flash memory, it is necessary to improve reliability.

DISCLOSURE OF INVENTION

A memory system according to an embodiment of the present invention comprises: a volatile first storing unit; a nonvolatile second storing unit; and a controller that performs data transfer between a host apparatus and the second storing unit via the first storing unit, stores management information including a storage position of the data stored in the second storing unit during a startup operation of the memory system into the first storing unit, and performs, while updating stored management information, data management in the first and second storing units based on the stored management information. The second storing unit stores therein the management information in a latest state stored into the first storing unit and management information storage information including storage position information indicating a storage position of the management information in the latest state, and the storage position information is read by the controller during the startup operation of the memory system, includes a second pointer indicating the storage position of the management information in the latest state in the second storing unit and a first pointer indicating a storage position of the second pointer. The first pointer being stored in a first pointer storage area in a fixed area, a storage position of which in the second storing unit is fixed, and the second pointer being stored in a second pointer storage area in an area excluding the fixed area in the second storing unit.

A memory system according to an embodiment of the present invention comprises: a volatile first storing unit; a nonvolatile second storing unit including a memory cell that can store therein multi-value data; and a controller that performs data transfer between a host apparatus and the second storing unit via the first storing unit, stores management information including a storage position of the data stored in the second storing unit during a startup operation of the memory system into the first storing unit, and performs, while updating stored management information, data management in the first and second storing unit based on the stored management information. The second storing unit includes a snapshot storage area for storing therein a snapshot that is acquired when a predetermined condition is satisfied and is the management information in the first storing unit, a log storage area for storing, when a change occurs in the management information, logs as difference information before and after the change, and a pointer storage area for storing a first pointer indicating a storage position of the snapshot storage area. The log storage area sequentially secures blocks as data erasing units according to a size of the log to be stored. A second pointer indicating a storage position of a top log stored in the log storing area is stored in the snapshot. The blocks store therein first block securing position information indicating a position of a block to be secured next.

BEST MODE(S) FOR CARRYING OUT THE INVENTION

Exemplary embodiments of a memory system according to the present invention are explained in detail below with reference to the accompanying drawings. The present invention is not limited by these embodiments.

First Embodiment

Figure 1:
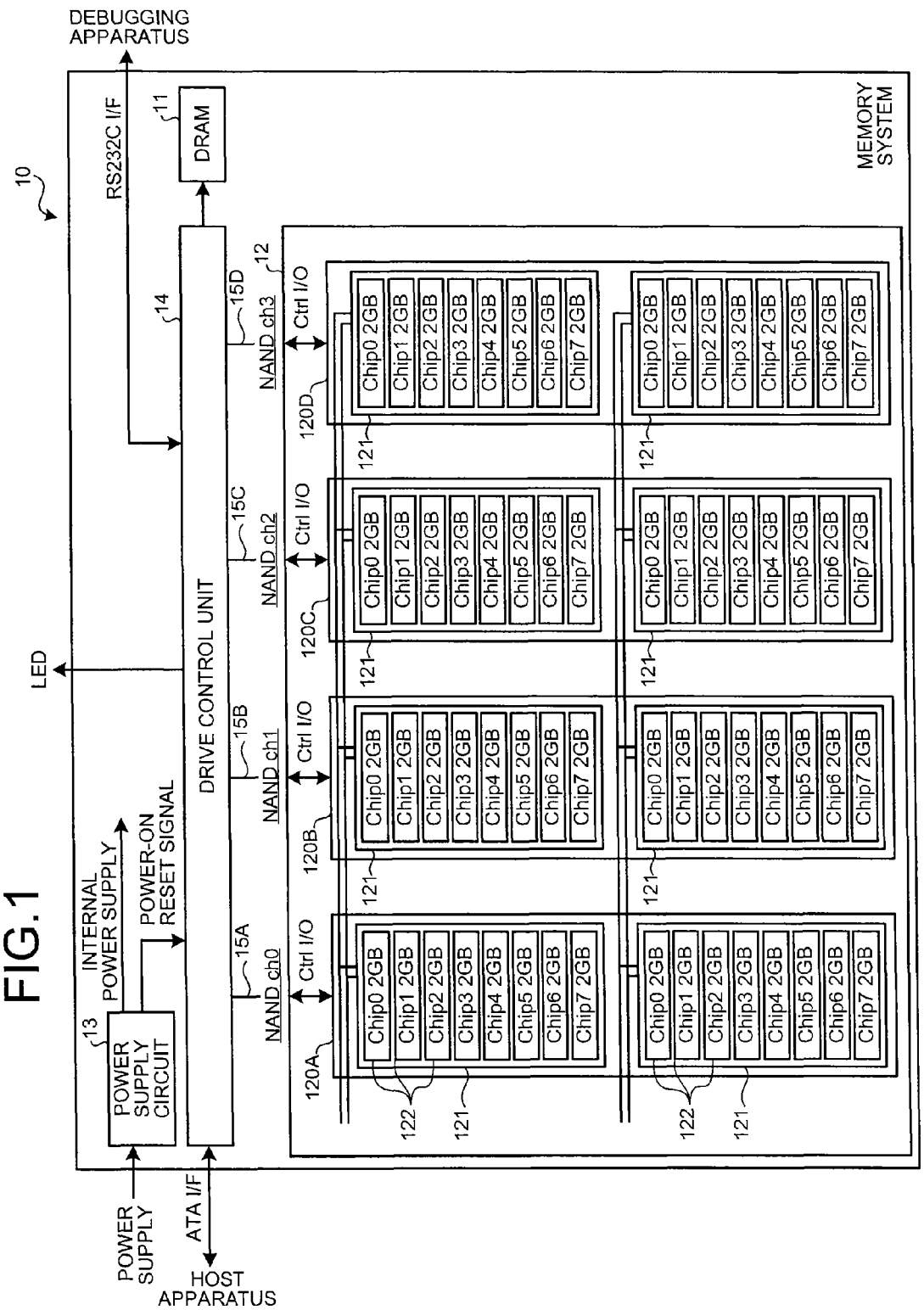
FIG. 1 is a block diagram of an example of a configuration of a memory system according to a first embodiment of the present invention.

A memory system according to a first embodiment of the present invention includes a nonvolatile semiconductor storage device and is used as a secondary storage device (SSD: Solid State Drive) of a host apparatus such as a personal computer. The memory system has a function of storing data requested by a host apparatus to be written and reading out data requested by the host apparatus to be read out and outputting the data to the host apparatus. FIG. 1 is a block diagram of an example of a configuration of a memory system 10 according to the first embodiment. This memory system 10 includes a DRAM (Dynamic Random Access Memory) 11 as a first storing unit, a NAND flash memory (hereinafter, "NAND memory") 12 as a second storing unit, a power supply circuit 13, and a drive control unit 14 as a controller.

The DRAM 11 is used as a storing unit for data transfer, management information recording, or a work area. Specifically, when the DRAM 11 is used as a storing unit for data transfer, the DRAM 11 is used for temporarily storing data requested by the host apparatus to be written before the data is written in the NAND memory 12, and the DRAM 11 is used to read out data requested by the host apparatus to be read out from the NAND memory 12 and temporarily storing the read data. When the DRAM 11 is used as a storing unit for management information recording, the DRAM 11 is used for storing management information for managing storage positions of data stored in the DRAM 11 and the NAND memory 12. When the DRAM 11 is used as a storing unit for a work area, the DRAM 11 is used, for example, during expansion of logs used when management information is restored.

The NAND memory 12 is used as a storing unit for storing therein data. Specifically, the NAND memory 12 stores therein data designated by the host apparatus and stores therein, for backup, management information managed by the DRAM 11. In FIG. 1, the NAND memory 12 that includes four channels 120A to 120D has been shown as an example. Each of the channels 120A to 120D includes two packages 121 each including eight chips 122 having a storage capacity of a predetermined size (e.g., 2 GB). The channels 120A to 120D are connected via the drive control unit 14 and buses 15A to 15D.

The power supply circuit 13 receives external power supply and generates a plurality of internal power supplies to be supplied to respective units of the memory system 10 from the external power supply. The power supply circuit 13 detects a state of the external power supply, i.e., a rising edge or a falling edge, generates a power-on reset signal based on the detected state, and outputs the power-on reset signal to the drive control unit 14.

The drive control unit 14 controls the DRAM 11 and the NAND memory 12. As explained in detail later, for example, the drive control unit 14 performs restoration processing for management information and storage processing for management information according to the power-on reset signal from the power supply circuit 13. The drive control unit 14 transmits and receives data to and from a host apparatus via an ATA interface (I/F) and transmits and receives data to and from a debugging apparatus via an RS232C I/F. Furthermore, the drive control unit 14 outputs a control signal for controlling on/off of an LED for state display provided on the outside of the memory system 10.

Figure 2:
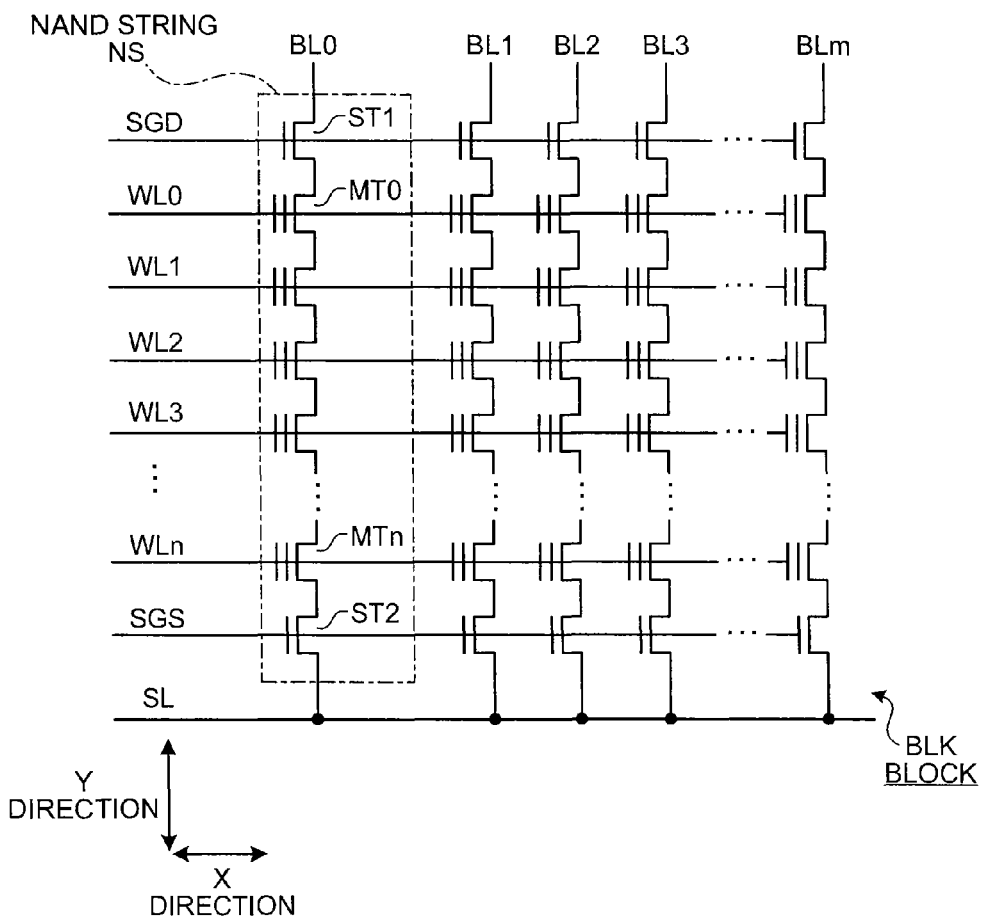
FIG. 2 is a circuit diagram of an example of a configuration of an arbitrary block of a NAND memory.

A configuration of the NAND memory 12 is explained in detail below. The NAND memory 12 is configured by arraying a plurality of blocks, which are units of data erasing, on a substrate. FIG. 2 is a circuit diagram of an example of a configuration of an arbitrary block of the NAND memory 12. In FIG. 2, left-right direction is set as an X direction and a direction perpendicular to the X direction is set as a Y direction.

Each block BLK of the NAND memory 12 includes (m+1) (m is an integer equal to or larger than 0) NAND strings NS arrayed in order along the X direction. Each NAND string NS has (n+1) (n is an integer equal to or larger than 0) memory cell transistors MT0 to MTn that share a diffusion region (a source region or a drain region) between memory cell transistors MT adjacent to each other in the Y direction. Moreover, the memory cell transistors MT0 to MTn are connected in series in the Y direction. In addition, selection transistors ST1 and ST2 arranged at both ends of a row of the (n+1) memory transistors MT0 to MTn.

Each memory cell transistors MT0 to MTn is a field effect transistor having a stacked gate structure formed on a semiconductor substrate. The stacked gate structure includes a charge accumulation layer (a floating gate electrode) formed on the semiconductor substrate via a gate insulating film and a control gate electrode formed on the charge accumulating layer via an inter-gate insulating film. Moreover, the memory cell transistors MT0 to MTn are multi-value memories in which a threshold voltage changes according to the number of electrons accumulated in the floating gate electrode and two or more bit data can be stored depending on the difference in the threshold voltage. It is assumed in following explanation that memory cell transistors MT0 to MTn are multi-value memories that can store quaternary values. However, the memory cell transistors MT0 to MTn can be multi-value memories that can store values larger than the quaternary values.

Word lines WL0 to WLn are respectively connected to the control gate electrodes of the memory cell transistors MT0 to MTn of each NAND string NS. Memory cell transistors MTi (i=0 to n) in each of the NAND strings NS are connected in common by the same word lines (i=0 to n). In other words, the control gate electrodes of the memory cell transistors MTi present on the same row in the block BLK are connected to the same word line WLi. (m+1) memory cell transistors MTi connected to the same word line WLi are treated as one page. In the NAND memory 12, writing and readout of data are performed in units of a page. Specifically, a group of the (m+1) memory cell transistors MTi connected to the same word line WLi is a unit that forms one page. In the case of the multi-value memory that can store quaternary values, a group of the memory cell transistors MTi connected to the same word line WLi forms two pages. When a page in which data is written first is set as a lower order page and a page in which data is written next is set as a higher order page, in the NAND memory 12, writing and readout of data is performed in units of the pages.

Bit lines BL0 to BLm are respectively connected to drains of the (m+1) selection transistors ST1 in one block BLK. A selection gate line SGD is connected in common to gates of the selection transistors ST1 of each NAND string NS. Sources of the selection transistors ST1 are connected to drains of the memory cell transistors MT0. Similarly, a source line SL is connected in common to sources of the (m+1) selection transistors ST2 in one block BLK. A selection gate line SGS is connected in common to gates of the selection transistors ST2 of each NAND string NS. Drains of the selection transistors ST2 are connected to sources of the memory cell transistors MTn.

Although not shown in the figure, bit lines BLj (j=0 to m) in one block BLK connect drains of the selection transistors ST1 in common between bit lines BLj of other blocks BLK. In other words, the NAND strings NS in the same column in the blocks BLK are connected by the same bit line BLj.

Figure 3A:
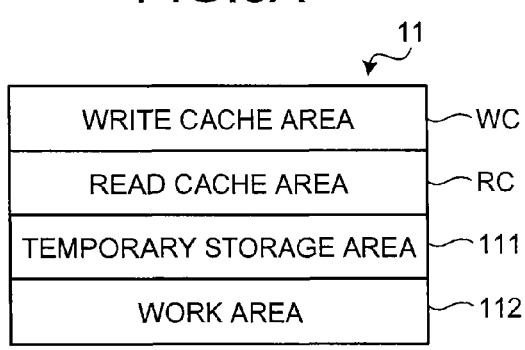
FIG. 3A is a schematic diagram of a functional configuration of a DRAM and FIG. 3B is a schematic diagram of a functional configuration of the NAND memory.

Functional configurations of the DRAM 11 and the NAND memory 12 are explained next. FIG. 3A is a schematic diagram of a functional configuration of the DRAM 11 and FIG. 3B is a schematic diagram of a functional configuration of the NAND memory 12.

As shown in FIG. 3A, the DRAM 11 includes a write cache area in which data requested by the host apparatus to be written is stored, a read cache area RC in which data requested by the host apparatus to be read out is stored, a temporary storage area 111 in which management information for managing storage positions of data stored in the DRAM 11 and the NAND memory 12 is stored, and a work area 112 used when the management information is restored.

Figure 3B:
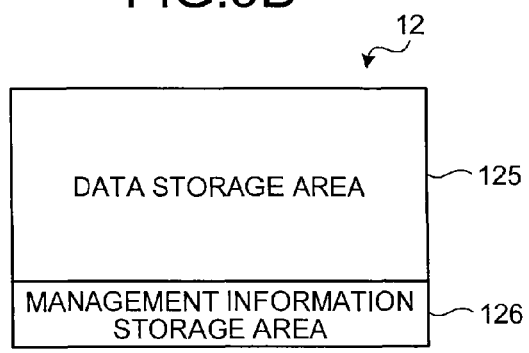

As shown in FIG. 3B, the NAND memory 12 includes a data storage area 125 in which data requested by the host apparatus to be written is stored and a management information storage area 126 in which the management information managed in the temporary storage area 111 of the DRAM 11 is stored. In this example, a data writing and readout unit in the NAND memory 12 is set as a page size unit. An erasing unit is set as a block size unit (e.g., 512 KB). Therefore, an area for storing respective blocks of the NAND memory 12 managed in block size units is further divided into areas of page size units.

Figure 4:
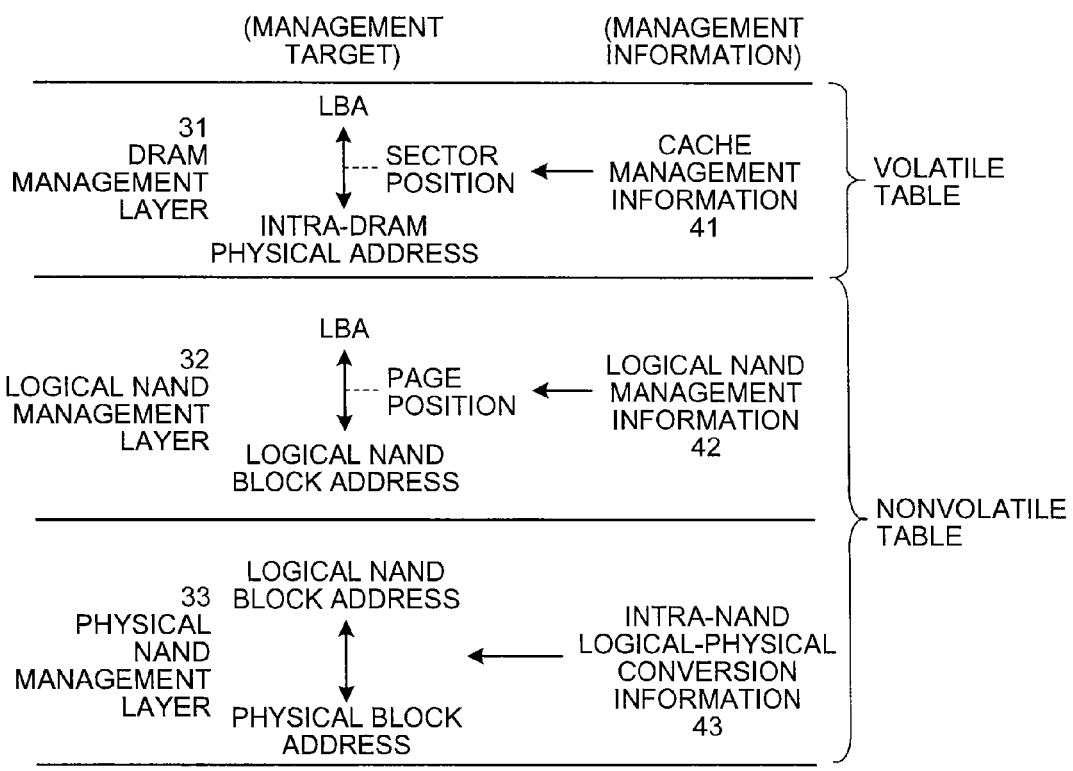
FIG. 4 is a diagram of an example of a layer structure for managing data stored in the memory system.

The management information managed in the temporary storage area ill of the DRAM 11 is explained below. FIG. 4 is a diagram of an example of a layer structure for managing data stored in the memory system 10. It is assumed here that this data is the data requested by the host apparatus to be written or read out. In the memory system 10, data management is performed by a three-layer structure: a DRAM management layer 31, a logical NAND management layer 32, and a physical NAND management layer 33. The DRAM management layer 31 performs data management in the DRAM 11 that plays a role of a cache. The logical NAND management layer 32 performs logical data management in the NAND memory 12. The physical NAND management layer 33 performs physical data management in the NAND memory 12, life extension processing for the NAND memory 12, and the like.

In the write cache area WC and the read cache area RC of the DRAM 11, data designated by a logical address (hereinafter, "LBA (Logical Block Address)") managed by an address managing method of the host apparatus is stored in a physical address in a predetermined range on the DRAM 11 (hereinafter, "intra-DRAM physical address"). Data in the DRAM management layer 31 is managed by cache management information 41 including a correspondence relation between an LBA of data to be stored and the intra-DRAM physical address and a sector flag indicating presence or absence of data in sector size units in a page.

Figure 5:
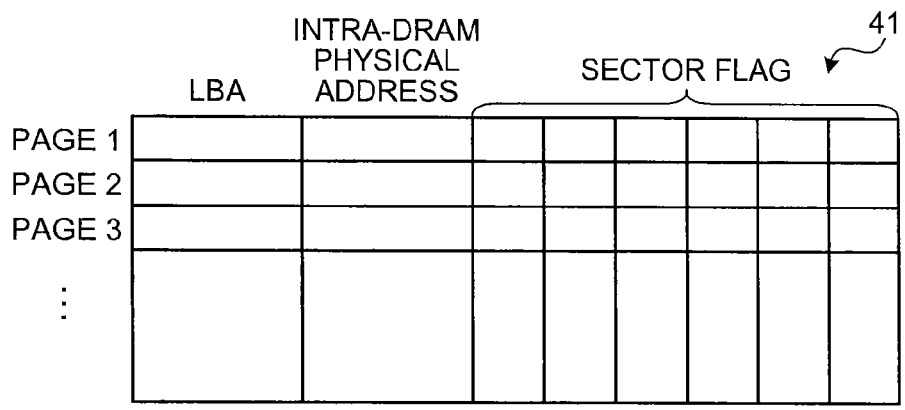
FIG. 5 illustrates an example of a cache management information table.

FIG. 5 illustrates an example of the cache management information 41 in tabular manner. The cache management information 41 is one entry for one area of a one page size of the DRAM 11. The number of entries is equal to or smaller than the number of pages that fit in the write cache area WC and the read cache area RC. In each of the entries, the LBA of data of a page size, the intra-DRAM physical address, and a sector flag indicating a position of valid data in each of areas obtained by dividing this page by a sector size are associated.

In the NAND memory 12, data from the DRAM 11 is stored in a physical address in a predetermined range (hereinafter, "intra-NAND physical address") on the NAND memory 12. In the NAND memory 12 formed by the multi-value memory, because the number of rewritable times is limited, the numbers of times of rewriting among the blocks configuring the NAND memory 12 are controlled by the drive control unit 14 to be equalized. In other words, when update of data written in a certain intra-NAND physical address in the NAND memory 12 is performed, the drive control unit 14 performs control to equalize the numbers of times of rewriting among the blocks configuring the NAND memory 12 to write, in a block different from the original block, data reflecting a portion required to be updated of a block in which the data to be updated is included and invalidate the original block.

As explained above, in the NAND memory 12, processing units are different in the writing and readout processing for data and the erasing processing for data. In the update processing for data, a position (a block) of data before update and a position (a block) of data after update are different. Therefore, in the first embodiment, an intra-NAND logical address used independently in the NAND memory 12 (hereinafter, "intra-NAND logical address") is provided besides the intra-NAND physical address.

Therefore, data in the logical NAND management layer 32 is managed by logical NAND management information 42 indicating a relation between an LBA of data in page size units received from the DRAM 11 and an intra-NAND logical address indicating a logical page position of the NAND memory 12 in which the received data is stored and a relation indicating an address range of a logical block having a size coinciding with that of a physical block as an erasing unit in the NAND memory 12. A collection of a plurality of the physical blocks can be set as a logical block. Data in the physical NAND management layer 33 is managed by intra-NAND logical address-physical address conversion information (hereinafter, "logical-physical conversion information) including a correspondence relation between the intra-NAND logical address of the logical block and the intra-NAND physical address of the physical block in the NAND memory 12.

Figure 6:
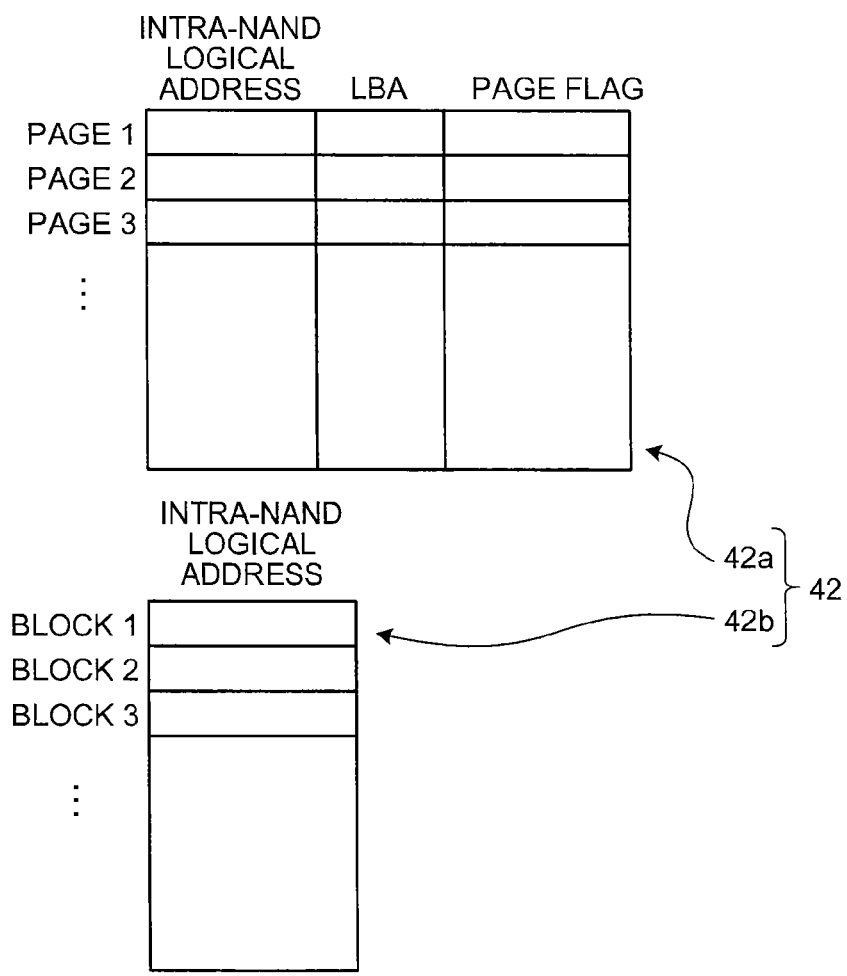
FIG. 6 illustrates an example of a logical NAND management information table.
Figure 7:
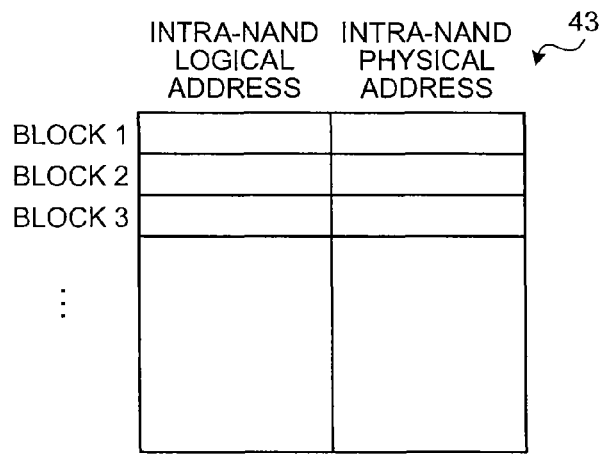
FIG. 7 illustrates an example of an intra-NAND logical-physical conversion information table.

FIG. 6 illustrates an example of the logical NAND management information 42 in tabular manner. FIG. 7 illustrates an example of intra-NAND logical-physical conversion information 43 in tabular manner. As shown in FIG. 6, the logical NAND management information 42 includes logical page management information 42a and logical block management information 42b. The logical page management information 42a has one entry for one logical area of a one page size. Each of entries includes an LBA of data of the one page size, an intra-NAND logical address, and a page flag indicating whether this page is valid. The logical block management information 42b includes an intra-NAND logical address set for a logical area of the one block size of the NAND memory 12. As shown in FIG. 7, in the intra-NAND logical-physical conversion information 43, the intra-NAND physical address and the inter-NAND logical address of the NAND memory 12 are associated.

By using these kinds of management information, a correspondence of the LBA used in the host apparatus, the intra-NAND logical address used in the NAND memory 12, and the intra-NAND physical address used in the NAND memory 12 can be established. This makes it is possible to exchange data between the host apparatus and the memory system 10.

The management information managed by the DRAM management layer 31 is lost because of power-off or the like so that this management information can be called a volatile table. On the contrary, if the management information managed by the logical NAND management layer 32 and the physical NAND management layer 33 is lost because of power-off or the like, the lost management information hinders successful startup of the memory system 10 so that measures are required to be taken such that the management information is stored even in the event of power-off or the like. Therefore, this management information can be called a nonvolatile table.

This nonvolatile table manages data stored in the NAND memory 12. If the nonvolatile table is not present, information stored in the NAND memory 12 cannot be accessed or data stored in an area is erased. Therefore, the nonvolatile table needs to be stored as latest information in preparation for sudden power-off. Therefore, in the first embodiment, management information including at least the nonvolatile table is stored in the latest state in the management information storage area 126 of the NAND memory 12. The management information storage information stored in the management information storage area 126 of the NAND memory 12 is explained below. The following explanation assumes that only the nonvolatile table is stored in the management information storage area 126.

Figure 8:
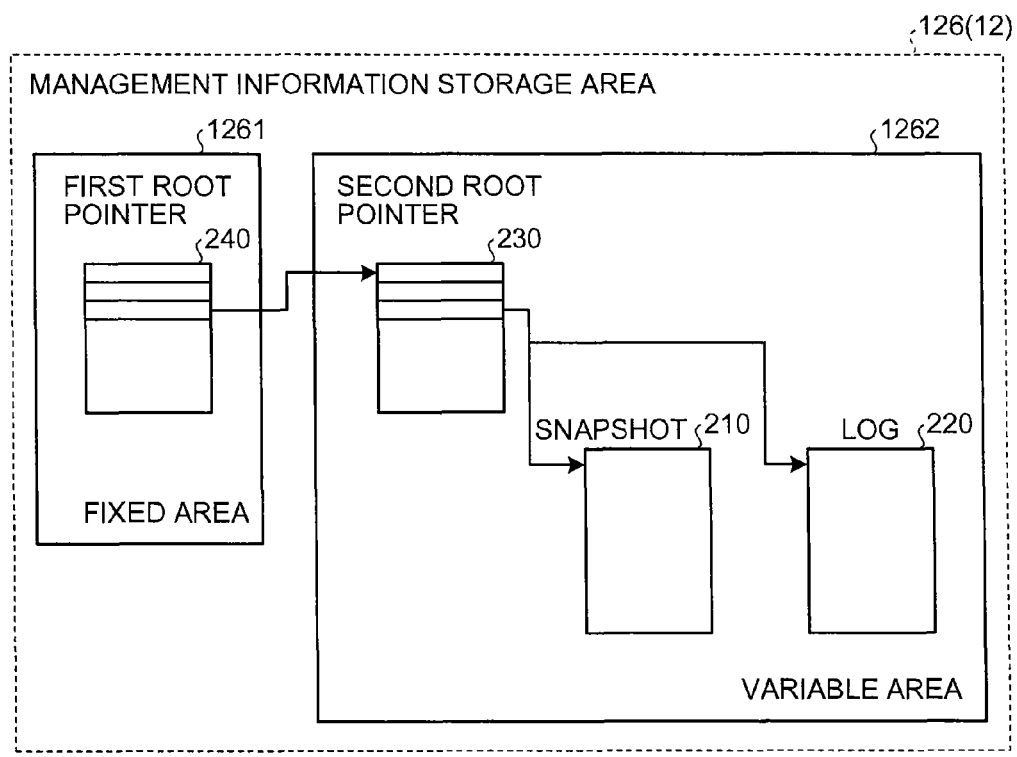
FIG. 8 is a schematic diagram of an example of contents of management information storage information stored in a management information storage area according to the first embodiment.

FIG. 8 is a schematic diagram of an example of contents of management information storage information stored in the management information storage area 126. The management information storage information stored in the management information storage information 126 includes a snapshot 210 as contents of the nonvolatile table at a certain point, a log 220 as difference information between the nonvolatile table, the contents of which are changed when there is a change in the contents, and the snapshot 210 (or the snapshot 210 and a log already generated), a second root pointer 230 indicating the snapshot 210 and a position (a block) of the log 220 acquired first concerning this snapshot 210, and a first root pointer 240 indicating a position (a block) where the second root pointer 230 is stored. The snapshot 210 is information obtained by storing management information including at least the nonvolatile table at a predetermined point among the kinds of management information stored in the temporary storage area 111 of the DRAM 11.

The snapshot 210, the log 220, the second root pointer 230, and the first root pointer 240 are stored in different blocks, respectively. The size of the blocks in which the snapshot 210, the log 220, the second root pointer 230, and the first root pointer 240 are stored, is the same as the size of a physical block as an erasing unit. The snapshot 210 is stored in a snapshot storing block. The snapshot 210 includes the logical NAND management information 42 and the intra-NAND logical-physical conversion information 43 as nonvolatile tables in the management information storage area 126 of the NAND memory 12. When a new snapshot 210 is stored, the new snapshot 210 is stored in a block different from that of the snapshot 210 stored before.

Figure 9:
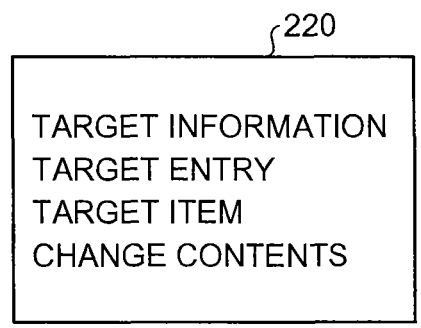
FIG. 9 depicts an example of a log.

The log 220 is stored in a dedicated log storing block. The log 220 is continuously written in the same log storing block even if a generation of a snapshot changes. FIG. 9 depicts an example of the log 220. The log 220 includes target information to be management information of a change target, a target entry as an entry to be a change target in the target information, a target item as an item to be a change target in the target entry, and change contents as content of a change of the target item.

The second root pointer 230 is stored in a dedicated second root pointer storing block. The second root pointer 230 only has to be a pointer that indicates a top address of a block indicating storage positions of the snapshot 210 and the log 220. However, a portion indicating a storage position of the snapshot 210 in the second root pointer 230 can be a portion that indicates top addresses of respective kinds of management information (nonvolatile tables) included in the snapshot 210. The second root pointer 230 is updated when the snapshot 210 is stored anew. A pointer of the log 220 can be stored in the snapshot 210 rather than in the second root pointer storing block.

Figure 10:
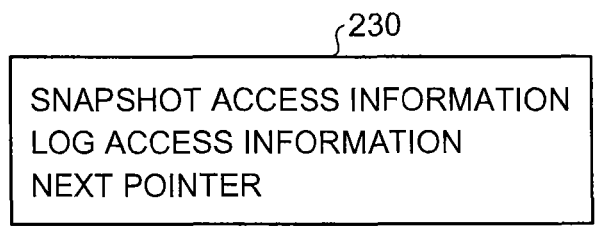
FIG. 10 depicts an example of a second root pointer.

FIG. 10 depicts an example of the second root pointer 230. Assuming that the size of one block is 512 KB, the second root pointer 230 is stored in one page having the size of 4 KB. The second root pointer 230 includes snapshot access information, log access information, and a next pointer. The snapshot access information is information for accessing a block in which a snapshot is stored. The log access information is information for accessing a block in which a log is stored. The log access information includes information for designating the block and information for designating a top page in the block in which a log related to a reference snapshot is stored. The next pointer is an index indicating a page in which the next second root pointer 230 is stored. The second root pointer 230 is changed to information in a linked list system by this next pointer. It is possible to reach the latest second root pointer 230 by tracking the next pointer from the top page of the second root pointer string block designated by the first root pointer 240. As an alternative to the linked list system, the second root pointer 230 can be stored in a write-once manner in order from the top page of the second root pointer storage area.

The first root pointer 240 is stored in a dedicated first root pointer storing block. The first root pointer 240 is information for accessing a block (a position) of the second root pointer storing block in which the second root pointer 230 is stored and is information read first in processing for restoring the management information when the memory system 10 is started. The first root pointer 240 is changed when the block in which the second root pointer is stored is changed. The first root pointer 240 is stored in the first root pointer storing block in a write-once manner in order from a top page of the block. In such a case, a page immediately preceding an unwritten page in the first root pointer storing block has latest information. Therefore, it is possible to retrieve the latest first root pointer 240 by retrieving a highest order page of the unwritten page. In the same manner as with the second root pointer 230, it is also possible to use a linked list for the first root pointer 240.

The first root pointer 240 is stored in a fixed area 1261 in the NAND memory 12. The snapshot 210, the log 220, and the second root pointer 230 are stored in a variable area 1262 in the NAND memory 12. The fixed area 1261 is an area in which a relation between a logical block managed by the logical NAND management layer 32 and a physical block managed by the physical NAND management layer 33 is fixed in the NAND memory 12 and is an area in which information necessary for running the memory system 10 having a low update frequency in which rewriting and writing hardly occurs is stored. The fixed area 1261 is, for example, an area set to write, when all blocks currently being written become full, information from a top page of the same block after erasing information in the block rather than writing information (the first root pointer 240) in another block in the management information storage area 126 (the NAND memory 12). In this example, the NAND memory 12 is configured by the multi-value memory. However, it is desirable to use the NAND memory 12 in a binary node in order to improve reliability of the first root pointer 240.

The variable area 1262 is an area in which the relation between the logical block managed by the logical NAND management layer 32 and the physical block managed by the physical NAND management layer 33 changes in an area of the NAND memory 12 excluding the fixed area 1261. The variable area 1262 is, for example, an area set to write, when all blocks currently being written become full, the next information in another block that is a writable free block in the variable area 1262 in the management information storage area 126. The variable area 1262 is an area excluding the fixed area 1261 in the NAND memory 12 as explained above. The variable area 1262 includes, besides the area in which the snapshot 210, the log 220, and the second root pointer 230 are stored in the management information storage area 126, the data storage area 125. In other words, the entire physical area in the NAND memory 12 excluding the fixed area 1261 is the variable area 1262. In the variable area 1262, the data storage area 125 and the area in which the snapshot 210, the log 220, and the second root pointer 230 are stored in the management information storage area 126 are functionally separated.

Figure 11:
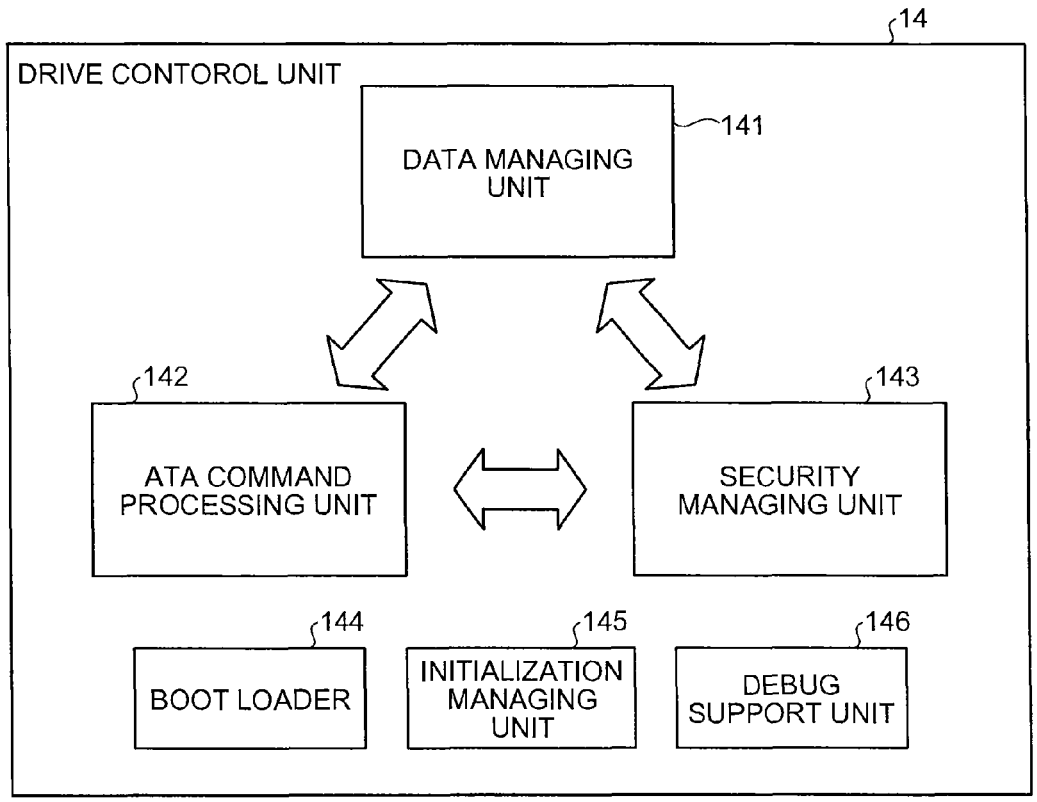
FIG. 11 is a block diagram of an example of a functional configuration of a drive control unit shown in FIG. 1.

Functions of the drive control unit 14 are explained below. FIG. 11 is a block diagram of an example of a functional configuration of the drive control unit 14. The drive control unit 14 includes a data managing unit 141, an ATA command processing unit 142, a security managing unit 143, a boot loader 144, an initialization managing unit 145, and a debug support unit 146. The data managing unit 141 performs data transfer between the DRAM 11 and the NAND memory 12 and control of various functions concerning the NAND memory 12. The ATA command processing unit 142 performs data transfer processing in cooperation with the data managing unit 141 based on an instruction received from an ATA interface. The security managing unit 143 manages various kinds of security information in cooperation with the data managing unit 141 and the ATA command processing unit 142. The boot loader 144 loads, during power-on, various management programs (firmware) from the NAND memory 12 to a not-shown memory (e.g., SRAM (Static RAM)). The initialization managing unit 145 performs initialization of controllers and circuits in the drive control unit 14. The debug support unit 146 processes debug data supplied from the outside via an RS232C interface.

Figure 12:
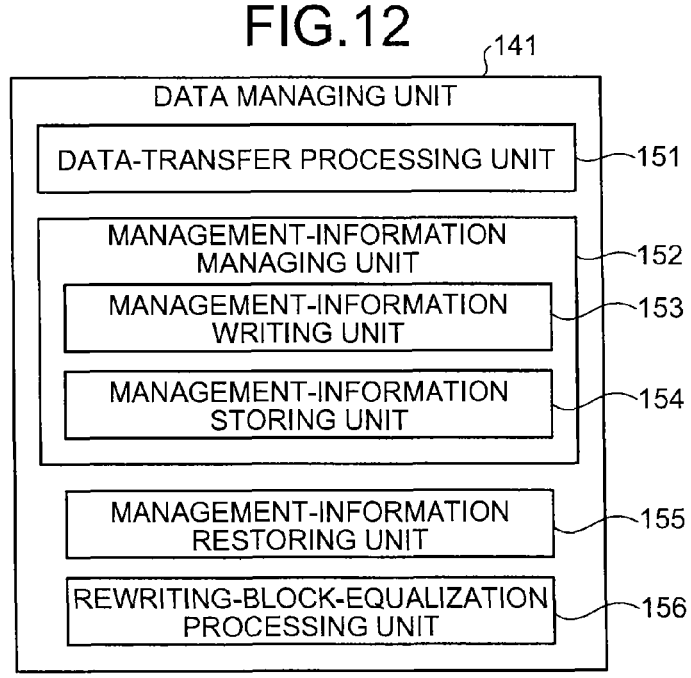
FIG. 12 is a block diagram of an example of a functional configuration of a data managing unit shown in FIG. 11.

FIG. 12 is a block diagram of an example of a functional configuration of the data managing unit 141. The data managing unit 141 includes a data-transfer processing unit 151, a management-information managing unit 152, a management-information restoring unit 155, and a rewriting-block-equalization processing unit 156. The data-transfer processing unit 151 performs data transfer between the DRAM 11 and the NAND memory 12. The management-information managing unit 152 performs change and storage of management information according to a change of data stored in the DRAM 11 and the NAND memory 12. The management-information restoring unit 155 restores latest management information based on management information stored during power-on or the like. The rewriting-block-equalization processing unit 156 equalizes, in an entire NAND memory, the number of times of writing of in a block in which data and management information storage information are written.

The management-information managing unit 152 includes a management-information writing unit 153 and a management-information storing unit 154. The management-information writing unit 153 performs update of the management information stored in the DRAM 11 when update of the management information is necessary according to the change processing for data stored in the DRAM 11 or the NAND memory 12 by the data-transfer processing unit 151.

When the memory system 10 satisfies a predetermined condition, the management-information storing unit 154 stores, in the management information storage area 126 of the NAND memory 12, the management information as the snapshot 210 and information to be updated in the management information as the log 220. When positions of writing in the second root pointer 230 or the second root pointer 230 and the first root pointer 240 are changed according to storage of the snapshot 210 or the log 220, the management-information storing unit 154 applies update processing to the second root pointer 230 or the second root pointer 230 and the first root pointer 240.

Storing of the snapshot 210 is performed by the management-information storing unit 154 when a predetermined condition relating to the memory system 10 is satisfied. Storing of the snapshot 210 is performed, for example, when a log storage area provided for storing the log 220 in the management information storage area 126 of the NAND memory 12 becomes full (i.e., the area is completely filled with data).

Storing of the log 220 is performed by the management-information storing unit 154 during data update (when data writing in the NAND memory 12 is necessary) on the NAND memory 12 involving update of the management information (the nonvolatile table) stored in the DRAM 11.

When the power supply of the memory system 10 is turned on, the management-information restoring unit 155 performs restoration processing for management information based on the management information storage information stored in the management information storage area 126 of the NAND memory 12. Specifically, the management-information restoring unit 155 traces the first root pointer 240 in the fixed area 1261 and the second root pointer 230 and the log 220 in the variable area 1262 in order and determines whether the log 220 corresponding to the latest snapshot 210 is present. When the log 220 is not present, the management-information restoring unit 155 restores, in the DRAM 11, the snapshot 210 of the snapshot storing block as management information. When the log 220 is present, because abnormal end such as a short break has occurred, the management-information restoring unit 155 acquires the snapshot 210 from the snapshot storing block, acquires the log 220 from the log storing block, and performs restoration of the management information (the nonvolatile table) reflecting the log 220 on the snapshot 210 on the DRAM 11.

The rewriting-block-equalization processing unit 156 selects a block at a rewriting destination such that the numbers of times of rewriting of blocks in the variable area 1262 are equalized when a block in the data storage area 125 in the NAND memory 12 and blocks in which the snapshot 210, the log 220, and the second root pointer 230 are stored in the management information storage area 126 are rewritten to other usable blocks in the variable area 1262. The rewriting-block-equalization processing unit 156 instructs the data-transfer processing unit 151, the management-information managing unit 152, and the management-information storing unit 154 to perform rewriting. When data, the snapshot 210, the log 220, and the second root pointer 230 are written in a new block, the rewriting-block-equalization processing unit 156 also selects a block at a rewriting destination such that the numbers of times of rewriting of the blocks in the variable area 1262 are equalized. The rewriting-block-equalization processing unit 156 instructs the data-transfer processing unit 151, the management-information managing unit 152, and the management-information storing unit 154 to perform rewriting. In this case, it is possible to designate a block at a rewriting destination regardless of whether there is a block used as the data storage area 125 in the past or a block in which the snapshot 210, the log 220, and the second root pointer 230 are stored in the management information storage area 126 as long as the block is a usable block in the variable area 1262.

Figure 13:
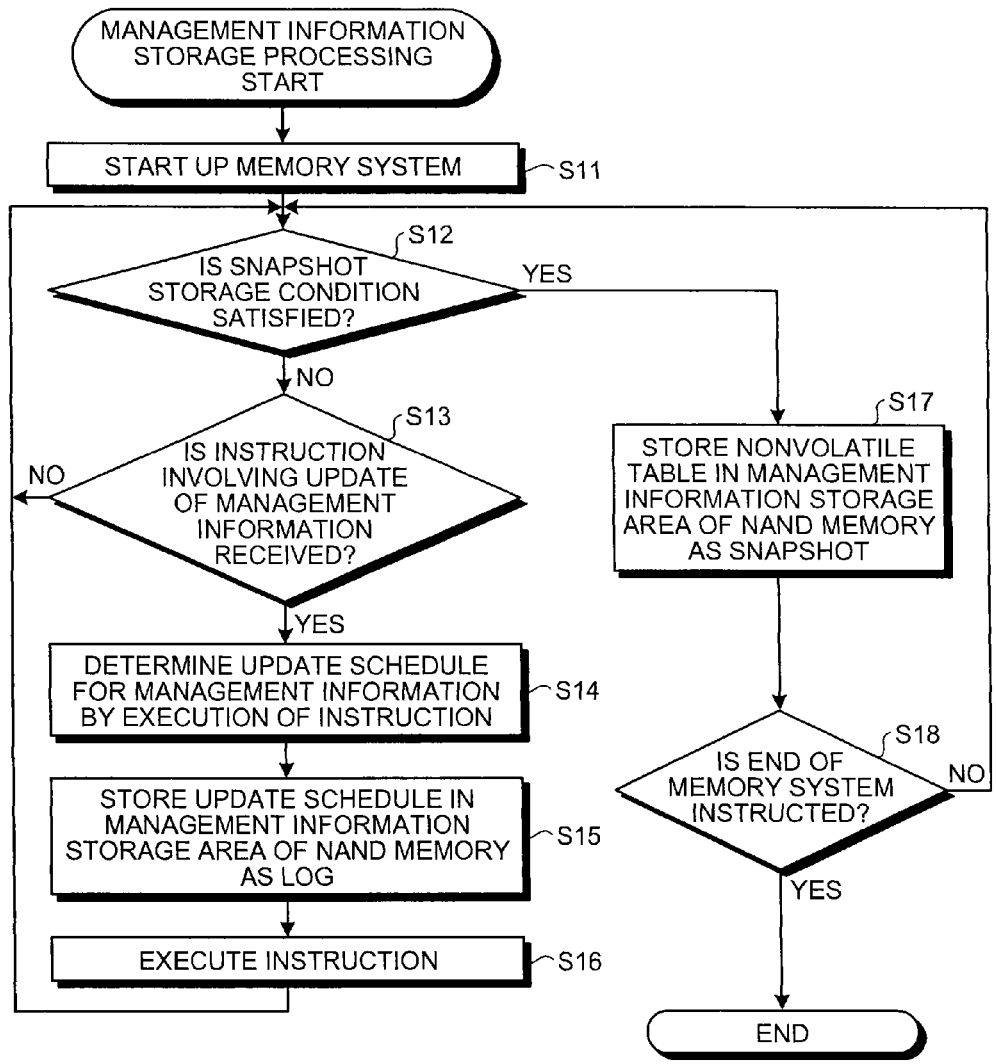
FIG. 13 is a flowchart of an example of a storage processing procedure for management information of the memory system.

The storage processing for the management information of the memory system 10 performed by the management-information managing unit 152 is explained below. FIG. 13 is a flowchart of an example of a storage processing procedure of the management information of the memory system 10. It is assumed that the memory system 10 is connected to a host apparatus and operates as a secondary storage device of the host apparatus, the host apparatus (the memory system 10) is in a started state, and the snapshot 210 is stored before the stop of the memory system 10 before this startup state.

First, the host apparatus (the memory system 10) is in a started state based on the snapshot 210 stored at the last end of the host apparatus (the memory system 10) (Step S11). Subsequently, the management-information managing unit 152 determines whether a predetermined snapshot storage condition is satisfied (Step S12). When the snapshot storage condition is not satisfied ("No" at Step S12), the management-information managing unit 152 determines whether an instruction involving update of the management information (instruction satisfying the log storage condition) is received (Step S13). When the instruction involving update of the management information is not received ("No" at Step S13), the management-information managing unit 152 returns to Step S12.

When the instruction involving update of the management information (an instruction for data writing in the NAND memory 12) is received ("Yes" at Step S13), the management-information managing unit 152 determines an update schedule indicating how the management information is to be updated by executing the instruction (Step S14). The management-information managing unit 152 stores the update schedule in the log storing block of the management information storage area 126 of the NAND memory 12 as the log 220 (Step S15). When the log 220 is not stored in the log storing block, the update schedule (the log) is difference information between the nonvolatile table at the present point and the snapshot 210 stored in the snapshot storing block. When the log 220 (hereinafter referred to as past log) is already stored in the log storing block, the update schedule (the log) is difference information between the nonvolatile table at the present point and a combination of the snapshot 210 and the past log. The log 220 is stored in the management information storage area 126 of the NAND memory 12, for example, after the log 220 (the update schedule) is recorded on the DRAM 11.

Subsequently, the logical NAND management layer 32 executes the instruction received at Step S13 (Step S16). As an example of such an instruction, there is writing processing for user data in a predetermined block of the data storage area of the NAND memory 12. Thereafter, the management-information managing unit 152 returns to Step S12 again.

When the snapshot storage condition is satisfied ("Yes" at Step S12), the management information including at least the nonvolatile table in the temporary storage area 111 of the DRAM 11 is stored in the management information storage area 126 of the NAND memory 12 as the snapshot 210 (Step S17). The management-information managing unit 152 determines whether the end of the memory system 10 is instructed (Step S18). When the end of the memory system 10 is not instructed ("No" at Step S18), the management-information managing unit 152 returns to Step S12. When the end of the memory system 10 is instructed ("Yes" at Step S18), the processing is finished.

Figure 14:
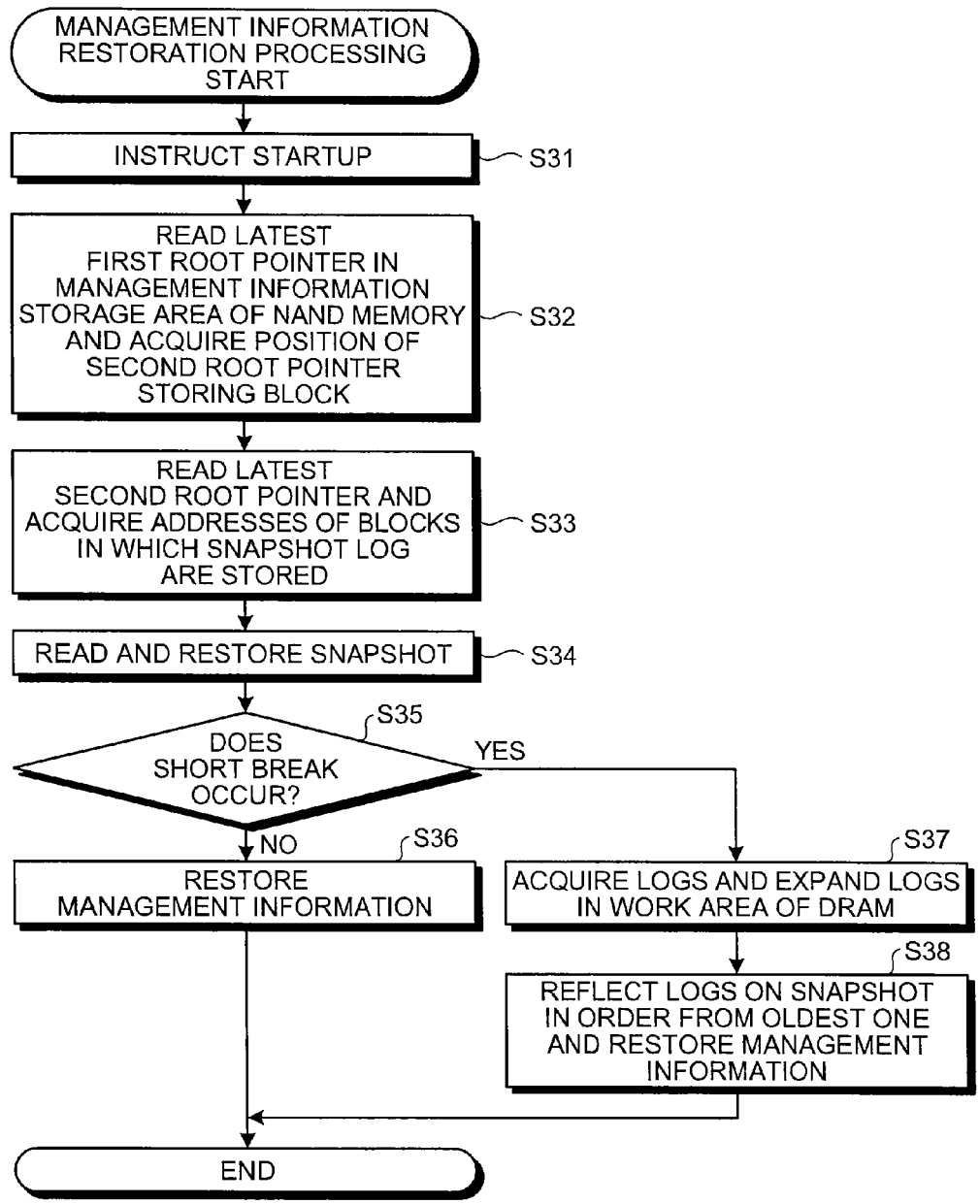
FIG. 14 is a flowchart of an example of a restoration processing procedure for the management information of the memory system.

Restoration processing for management information of the memory system 10 performed by the management-information restoring unit 155 is explained below. FIG. 14 is a flowchart of an example of a restoration processing procedure for the management information of the memory system 10. As in the above explanation, the memory system 10 is connected to the host apparatus and operates as the second storage device of the host apparatus.

First, the power supply of the host apparatus is turned on and a startup instruction is issued to the memory system 10 (Step S31). The management-information restoring unit 155 reads a latest first root pointer in the management information storage area 126 of the NAND memory 12 and acquires the position of a second root pointer storing block (Step S32). Subsequently, the management-information restoring unit 155 reads a latest second root pointer from the acquired position of the second route pointer storing block and acquires addresses of blocks in which the snapshot 210 and the log 220 are stored (Step S33). The management-information restoring unit 155 reads the snapshot 210 from the address in the NAND memory 12 acquired at Step S33 and restores the snapshot 210 in the temporary storage area ill of the DRAM 11 (Step S34).

Thereafter, the management-information restoring unit 155 determines whether a short break has occurred referring to the log 220 in the NAND memory 12 (Step S35). When a short break has not occurred ("No" at Step S35), at Step S34, the management-information restoring unit 155 restores the management information from the snapshot 210 restored in the temporary storage area 111 of the DRAM 11 (Step S36) and the restoration processing ends.

On the other hand, when a short break has occurred ("Yes" at Step S35), the management-information restoring unit 155 acquires the log 220 from the address in the NAND memory 12 acquired at Step S33 and expands the log 220 in the work area 112 of the DRAM 11 (Step S37). The management-information restoring unit 155 reflects, in order from oldest one, logs on the snapshot 210 restored in the temporary storage area 111 of the DRAM 11 at Step S34 and restores the management information (the nonvolatile table) (Step S38) and the restoration processing for the management information ends.

As explained above, according to the first embodiment, as a pointer indicating storage positions of the snapshot 210 and the log 220 as latest storage information of the memory system 10, the second root pointer 230 indicating the storage positions of the snapshot 210 and the log 220 is provided in the variable area 1262 and the first root pointer 240 indicating a storage position of the second root pointer 230 is provided in the fixed area 1261. As a result, it is unnecessary to update the first root pointer 240 until all blocks for second root point storage become full with data. Moreover, it becomes possible to substantially reduce an update frequency of the first root pointer 240 compared with an update frequency of the second root pointer 230. For example, when the second root pointer 230 is not provided and the first root pointer 240 is adapted to point the storage positions of the snapshot 210 and the log 220, the first root pointer 240 is updated every time the snapshot 210 is updated. As a result, the number of times of erasing of the block for first root point storage increases. On the other hand, by providing the second root pointer 230, it is possible to hold down the number of times of erasing of the block for first root point storage to a number obtained by dividing the number of times of update of the snapshot 210 by the number of pages of the second root pointer 230. It is possible to substantially reduce the number of times of erasing the block for first root point storage. As a result, there is an effect that it is possible to extend the life of a memory cell transistor configuring the fixed area 1261. Further, because it is possible to hold down the number of times of rewriting of the block for first root pointer storage in which the first root pointer 240 is stored, there is also an effect that it is possible to improve reliability of the first root pointer 240 as stored data.

Second Embodiment

As a second embodiment according to the present invention, a method of processing for writing a log when the size of a log stored in a log storage area exceeds the size of a log storing block is explained below.

Figure 15:
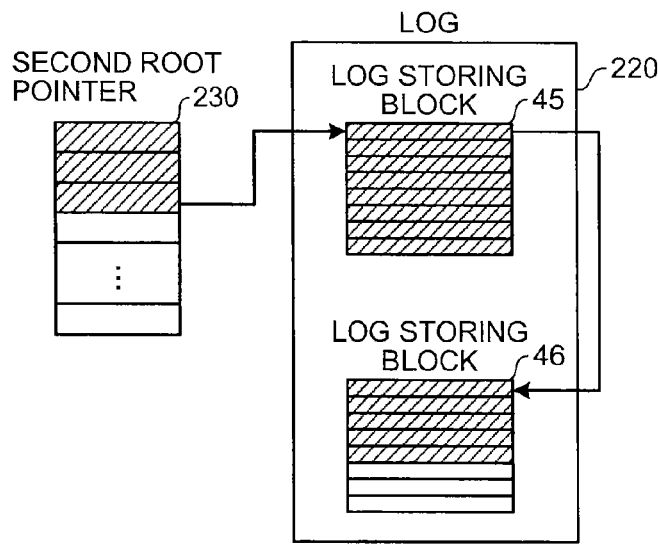
FIG. 15 depicts an example of the structure of a log storage area for storing logs according to a second embodiment of the present invention.

FIG. 15 is a diagram of an example of the structure of the log storage area for storing the log according to the second embodiment. In FIG. 15, among the components shown in FIG. 8, only the second root pointer 230 and the log 220 are shown and the other components are omitted.

The log 220 includes log information stored in respective pages indicated by shaded portions, for example, in the log storage area including log storing blocks 45 and 46. The number of log storing blocks forming the log storage area depends on the size of a log to be stored (log length). In the log storage area, when log storing blocks are sequentially secured according to the size of the log to be stored and the log is written in all pages of a log storing block being written, the log is written in a log storing block secured next. In the example shown in FIG. 15, the log is stored in order from a top page of the log storing block 45. After the log is written in all pages in the log storing block 45, the log is sequentially stored from a top page of the log storing block 46 secured as the next block for writing.

The second root pointer 230 indicates a top address of a block indicating a storage position of the log 220. Specifically, the second root pointer 230 indicates the top page of the log storing block 45.

The log storing block 45 stores therein a pointer indicating the position of the log storing block 46. Specifically, when the top page of the log storing block 45 is used, the log storing block 46 is secured and pointer information indicating an address of the top page of the log storing block 46 is added to the top page of the log storing block 45. This makes it possible to trace the second root pointer 230, the log storing block 45, and the log storing block 46 in order and reach a last log for the snapshot 210. The log storing block 46 stores therein a pointer indicating the position of a log storing block secured next (not shown). When the top page of the log storing block 46 is used, the next log storing block is secured and pointer information indicating an address of a top page of the next log storing block is added to the top page of the log storing block 46. In FIG. 15, as an example, the log is stored in the two log storing blocks (the log storing blocks 45 and 46). However, the same applies when the log is stored in three or more log storing blocks.

As explained above, in the second embodiment, when a log storage area includes a plurality of log storing blocks, pointer information indicating the position of a log storing block secured next is stored in a top page of a log storing block such that a log stored in different log storing blocks can be traced via a pointer. In other words, the log storage area includes sequentially secured log storing blocks and has the structure in which the log storing blocks are connected in a chain shape via a pointer indicating between the log storing blocks (hereinafter referred to as log chain).

According to the second embodiment, even when the size of the log 220 stored in the log storage area exceeds the size of the log storing block, because it is possible to secure a log storing block anew and write a log in the new log storing block, it is unnecessary to store the snapshot and update the second root pointer 230 every time the log storing block is filled. Consequently, writing in the second root pointer storing block in which the second root pointer 230 is stored is reduced. Therefore, there is an effect that it is possible to reduce the number of times of writing in the NAND memory 12 and suppress the durable life of the NAND memory 12 from decreasing.

Timing when the log storing block secures the pointer is not limited to the time when a top page of the log storing block is used and may be the time when other pages are used. Therefore, for example, the log storing block 46 may be secured at a point when writing of the log in a last page of the log storing block 45 is finished and a pointer indicating an address of the top page of the log storing block 46 may be provided.

It is preferable to provide an upper limit in the number of log storing blocks that can be secured in the log storage area. This is because, if the size of the log 220 exceeds a predetermined size, when it is necessary to reflect the log 220 on the snapshot 210 and restore the management information, restoration time is long. For example, when the log storage area is filled, a new snapshot 210 can be acquired.

Third Embodiment

In the first and second embodiments, as shown in FIG. 8, one log is generated for the snapshot. However, in a third embodiment according to the present invention, a plurality of logs are generated.

Figure 16:
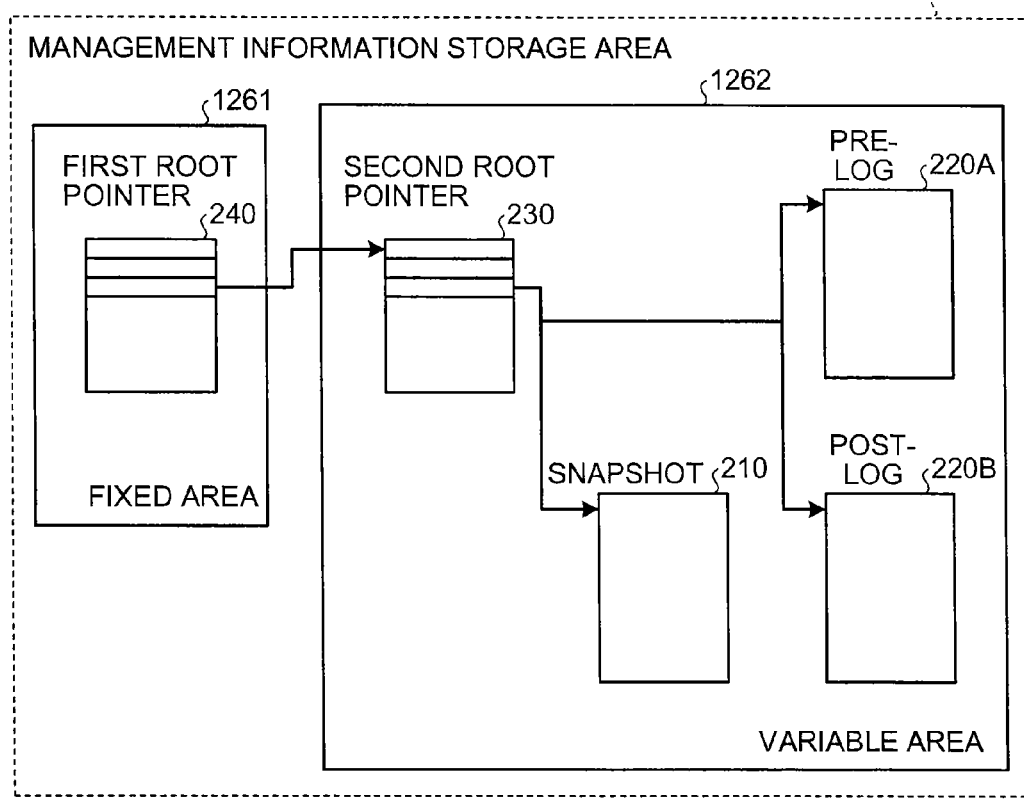
FIG. 16 is a schematic diagram of an example of contents of management information storage information stored in a management information storage area according to a third embodiment.

FIG. 16 is a schematic diagram of an example of contents of management information storage information stored in a management information storage area according to the third embodiment. In the third embodiment, the log 220 shown in FIG. 8 in the first embodiment is subdivided into a pre-update log(hereinafter, "pre-log") 220A and an update post-log (hereinafter, "post-log") 220B. The pre-log 220A is update difference information of contents of a nonvolatile table before taking a snapshot next time and is acquired before update. The post-log 220B is log information of contents same as those of the pre-log 220A and is stored after the update. Components same as those in the first embodiment are denoted by the same reference numerals and signs and explanation of the components is omitted.

The pre-log 220A and the post-log 220B are difference information between the nonvolatile table after contents are changed when there is a change in contents of the nonvolatile table and the snapshot 210 (or the snapshot 210 and a log already generated) corresponding to the data writing processing, etc. Specifically, the first pre-log 220A and the first post-log 220B after the snapshot 210 is taken are difference information between the nonvolatile table and the snapshot 210. The second or subsequent pre-log 220A after the snapshot 210 is taken is difference information between a combination of the pre-log 220A already generated and the snapshot 210 and the nonvolatile table. The second or subsequent post-log 220B after the snapshot 210 is taken is difference information between a combination of the post-log 220B already generated and the snapshot 210 and the nonvolatile table. In other words, the pre-log 220A and the post-log 220B contain the same information. Although the pre-log 220A and the post-log 220B is explained to contain the same information, it is not necessary that the pre-log 220A and the post-log 220B contain the same information. For example, any one of the pre-log 220A and the post-log 220B can be configured to contain the difference information.

The pre-log 220A is information generated before the management information is actually updated. Therefore, before the management information is actually updated by the execution of data writing processing or the like, the pre-log 220A is generated based on an update schedule concerning how the management information is updated. The post-log 220B is information generated after the management information is actually updated. Therefore, the post-log 220B is generated by using the actual management information after the management information is actually updated according to the execution of data writing processing or the like. The pre-log 220A and the post-log 220B include, for example, information of contents shown in FIG. 9.

The pre-log 220A and the post-log 220B are stored in log storing blocks, respectively. The pre-log 220A and the post-log 220B are written in the same log storing blocks in a write-once manner even if a generation of the snapshot changes.

Differences from the first embodiment among the functions of the processing units of the data managing unit 141 shown in FIG. 12 in the first embodiment are explained below. When the memory system 10 satisfies predetermined conditions, the management-information storing unit 154 stores, in the management information storage area 126 of the NAND memory 12, the management information as the snapshot 210, information to be updated in the management information as the pre-log 220A, and updated information in the management information as the post-log 220B. When a position of writing in the second root pointer 230 is changed according to storage of the snapshot 210, the pre-log 220A, or the post-log 220B, the management-information storing unit 154 applies update processing to the second root pointer 230.

The storage of the snapshot 210 by the management-information storing unit 154 is executed when any one of three snapshot storage conditions explained as examples below is satisfied:

(1) Standby (an instruction for minimizing power consumption of a main body of the memory system 10), sleep (an instruction for stopping a device when there is no access during a predetermined time), or reset (an instruction for restarting the memory system 10) is received, (2) The log storage area provided for storing the pre-log 220A and the post-log 220B in the management information storage area 126 of the NAND memory 12 becomes full with data, (3) The log storage area provided to store the pre-log 220A and the post-log 220B in the management information storage area 126 of the NAND memory 12 changes to a failure area (a bad block) in which data writing and erasing cannot be performed.

Timing when the management-information storing unit 154 stores the pre-log 220A and the post-log 220B is the time when update of the management information (the nonvolatile table) stored in the DRAM 11 is performed by the management-information writing unit 153. Specifically, the pre-log 220A and the post-log 220B are stored before and after processing for writing data, etc.

When the power supply of the memory system 10 is turned on, the management-information restoring unit 155 performs restoration processing for management information based on management information storage information stored in the management information storage area 126 of the NAND memory 12. Specifically, the management-information restoring unit 155 traces the first root pointer 240 in the fixed area, the second root pointer 230 in the variable area 1262, the snapshot 210, the pre-log 220A, and the post-log 220B in order and determines whether the pre-log 220A and the post-log 220B corresponding to the latest snapshot 210 are present. When the pre-log 220A and the post-log 220B are not present, the management-information restoring unit 155 restores the snapshot 210 of the snapshot storing block as management information in the DRAM 11. When the pre-log 220A and the post-log 220B are present, the end of the memory system 10 is the abnormal end due to a program error and a short break (abnormal shutdown of power). Therefore, the management-information restoring unit 155 acquires the snapshot 210 from the snapshot storing block, acquires the pre-log 220A or the post-log 220B from the log storing block, and performs restoration of the management information (the nonvolatile table) reflecting the pre-log 220A or the post-log 220B on the snapshot 210 on the DRAM 11.

The storage processing for management information of the memory system 10 performed by the management-information managing unit 152 is explained below. To explain simply, in the flowchart of FIG. 13 in the first embodiment, processing for writing the post-log 220B having the same contents as the pre-log 220A is performed after the execution of the instruction at Step S16. This processing is specifically explained below.

Figure 17:
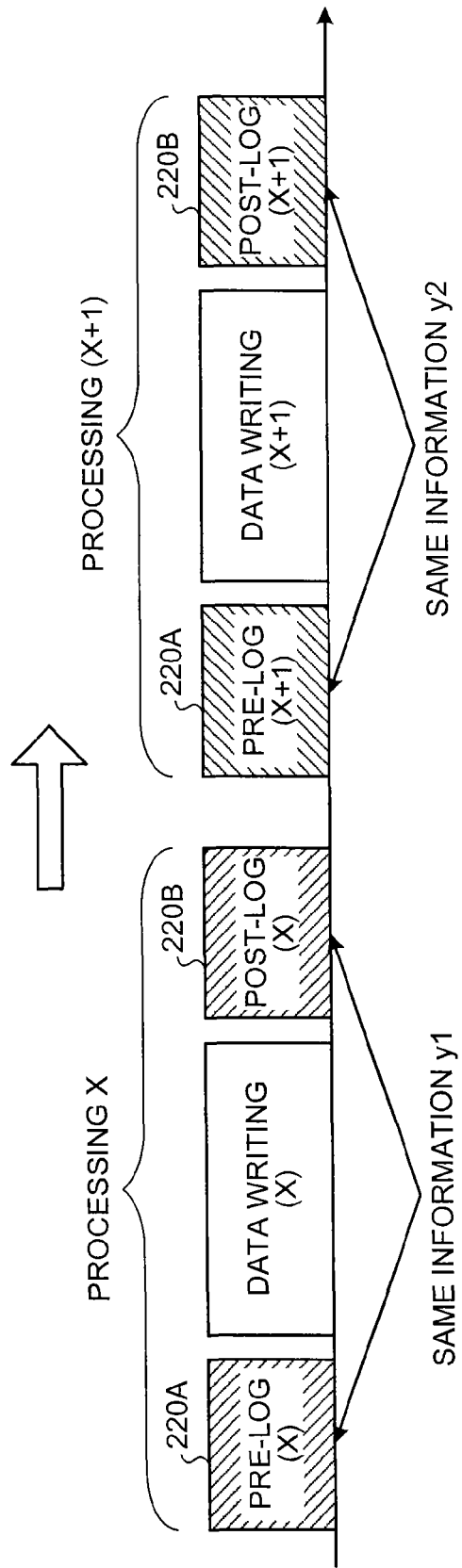
FIG. 17 is a diagram for explaining storage processing for a pre-log and a post-log.

FIG. 17 is a diagram for explaining storage processing for a pre-log and a post-log. When the pre-log 220A has not been stored in the log storing block, the update schedule (the pre-log) to be determined at Step S14 is difference information between the nonvolatile table at the time when the management information is updated and the snapshot 210 stored in the snapshot storing block. When the pre-log 220A (hereinafter, "the pre-log 220A in the past") is already stored in the log storing block, the update schedule (the pre-log) is difference information between the nonvolatile table at the time when the management information is updated and a combination of the snapshot 210 and the pre-log 220A in the past. Specifically, as shown in FIG. 17, before data writing (X) is performed as writing processing for Xth data, a pre-log (X) corresponding to the data writing (X) is stored in the NAND memory 12 as the pre-log 220A. At this point, for example, information y1 is stored as the pre-log 220A. The pre-log 220A is stored in the management information storage area 126 of the NAND memory 12, for example, after the pre-log 220A (the update schedule) is recorded on the DRAM 11.

Subsequently, the logical NAND management layer executes the instruction received at Step S13 (e.g., processing for writing (X) user data in the data storage area 125 of the NAND memory 12) (Step S16).

Thereafter, the management information stored in the DRAM 11 is updated according to the executed processing. The management-information storing unit 154 stores the updated information in the management information in the management information storage area 126 of the NAND memory 12 as the post-log 220B. When the post-log 220B has not been stored in the log storing block, the post-log 220B is difference information between the nonvolatile table at the present point and the snapshot 210 stored in the snapshot storing block. When the post-log 220B (hereinafter, "the post-log 220B in the past") is already stored in the log storing block, the post-log 220B is difference information between the non volatile table at the present point and a combination of the snapshot 210 and the log in the past.

Consequently, a post-log 220B(X) corresponding to the data writing (X) is stored in the NAND memory 12 as the post-log 220B. At this point, the information y1 is stored as the post-log 220B. The information y1 stored as the post-log 220B is the same as the information y1 stored as the pre-log 220A.

Thereafter, when the snapshot storage condition is not satisfied ("No" at Step S12) and the instruction involving update of the management information is received ("Yes" at Step S13), the processing explained above is performed. In other words, in the same manner as the writing processing for the Xth data, writing processing for (X+1)th data is performed. Before data writing (X+1) is performed as the writing processing for the (X+1)th data, a pre-log(X+1) corresponding to the data writing (X+1) is stored in the NAND memory 12 as the pre-log 220A. For example, information y2 is stored as the pre-log 220A. The data writing (X+1) is performed in the data storage area 125 in the NAND memory 12. Further, a post-log(X+1) corresponding to the data writing (X+1) is stored in the NAND memory 12 as the post-log 220B. For example, the information y2 is stored as the post-log 220B. The information y2 stored as the post-log 220B is the same as the information y2 stored as the pre-log 220A. As explained above, the pre-log 220A and the post-log 220B are stored.

Figure 18:
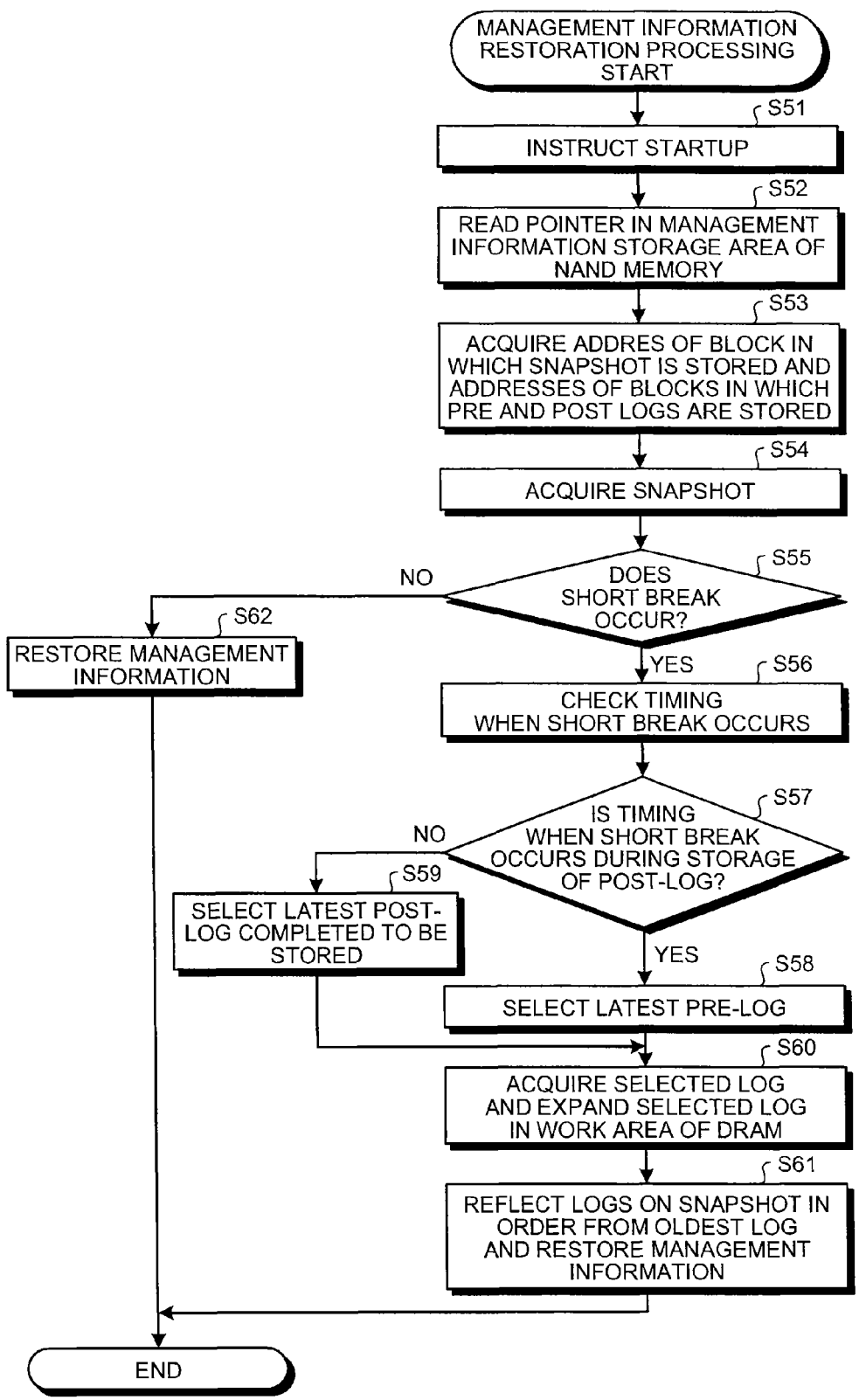
FIG. 18 is a flowchart of an example of a restoration processing procedure for management information of a memory system according to the third embodiment.

Restoration processing for management information of the memory system 10 performed by the management-information restoring unit 155 is explained below. FIG. 18 is a flowchart of an example of a restoration processing procedure for management information of the memory system 10 according to the third embodiment. As in the first and second embodiments, the memory system 10 is connected to the host apparatus and operates as the secondary storage device of the host apparatus.

As explained at Steps S31 to S34 of FIG. 14 in the first embodiment, the power supply of the host apparatus is turned on according to, for example, recovery from a short break and a startup instruction is issued to the memory system 10. The management-information restoring unit 155 reads the first root pointer 240 and the second root pointer 230 in the management information storage area 126 of the NAND memory 12 in order, acquires addresses of blocks in which the snapshot 210 and the pre and post logs (the pre-log 220A and the post-log 220B) are stored, and acquires the snapshot 210 (Steps S51 to S54).

Thereafter, the management-information restoring unit 155 determines, referring to the pre-log 220A and the post-log 220B in the NAND memory 12, whether a short break has occurred (Step S55). For example, when the pre-log 220A and the post-log 220B are present in the NAND memory 12, it is determined that a short break has occurred. The determination on whether a short break has occurred can be performed by, for example, comparing the pre-log 220A and the post-log 220B. In the third embodiment, the pre-log 220A and the post-log 220B store the same information. Therefore, for example, when the number of pages stored as the pre-log 220A and the number of pages stored as the post-log 220B do not coincide with each other, it is possible to determine that a short break has occurred. The occurrence of the short break can be determined based on presence or absence of an ECC error, data of a page stored as the pre-log 220A, and data of a page stored as the post-log 220B.

When a short break has occurred ("Yes" at Step S55), the management-information restoring unit 155 checks, based on the latest pre-log 220A and the latest post-log 220B in the NAND memory 12, timing when the short break has occurred (Step S56).

Further, the management-information restoring unit 155 determines whether the timing when the short break has occurred is during storage of the post-log 220B (Step S57). For example, when a last page in the post-log 220B is being written, this last page cannot be read out. Therefore, it is determined that the short break occurs during storage of the post-log 220B. When a last page in the pre-log 220A is being written, this last page cannot be read out. Therefore, it is determined that the short break occurs during storage of the pre-log 220A. When a log is written in the last page in the pre-log 220A and a log is not written in the past page in the post-log 220B, it is determined that the short break occurs during writing of data.

When the management-information restoring unit 155 determines that the timing when the short break has occurred is during storage of the post-log 220B ("Yes" at Step S57), the management-information restoring unit 155 selects the latest pre-log 220A (Step S58). On the other hand, when the management-information restoring unit 155 determines that the timing when the short break has occurred is not during storage of the post-log 220B ("No" at Step S57), the management-information restoring unit 155 selects the latest post-log 220B completed to be stored (Step S59). In other words, when the last page in the pre-log 220A are being written or when a log is written in the last page in the pre-log 220A and a log is not written in the last page in the post-log 220B, the latest post-log 220B is selected.

Thereafter, the management-information restoring unit 155 acquires the selected log (the pre-log 220A or the post-log 220B) from the log storing block and expands the log in the work area 112 of the DRAM 11 (Step S60). The management-information restoring unit 155 reflects logs on the snapshot 210 in order from oldest one and restores the management information (the nonvolatile table) (Step S61), and the restoration processing for the management information ends.

On the other hand, when a short break does not occur ("No" at Step S55), the management information is restored in the management information storage area 111 of the DRAM 11 and the management information restoration processing ends.

The management-information restoring unit 155 can select, regardless of presence or absence of breakage of logs due to a short break, one of the pre-log 220A and the post-log 220B and restore the management information based on the number of pages stored as the pre-log 220A and the number of pages stored as the post-log 220B. For example, when the number of pages stored as the pre-log 220A and the number of pages stored as the post-log 220B are the same, the management-information restoring unit 155 selects the pre-log 220A and restores the management information. When the number of pages stored as the pre-log 220A is larger than the number of pages stored as the post-log 220B, the management-information restoring unit 155 selects the post-log 220B and restores the management information.

As explained above, even when the pre-log 220A and the post-log 220B are generated before and after the processing is executed, by applying the technique of the first and second embodiments, it is possible to reduce the number of times of writing of the first root pointer 240 and the second root pointer 230 in the NAND memory 12, suppress the durable life of the NAND memory 12 from decreasing, and improve reliability during storage of the management information.

Fourth Embodiment

As a fourth embodiment according to the present invention, a method of processing for writing a log when the sizes of logs stored in a pre-log storage area and a post-log storage area, respectively, exceed the sizes of log storing blocks of the respective log storage areas is explained.

Figure 19:
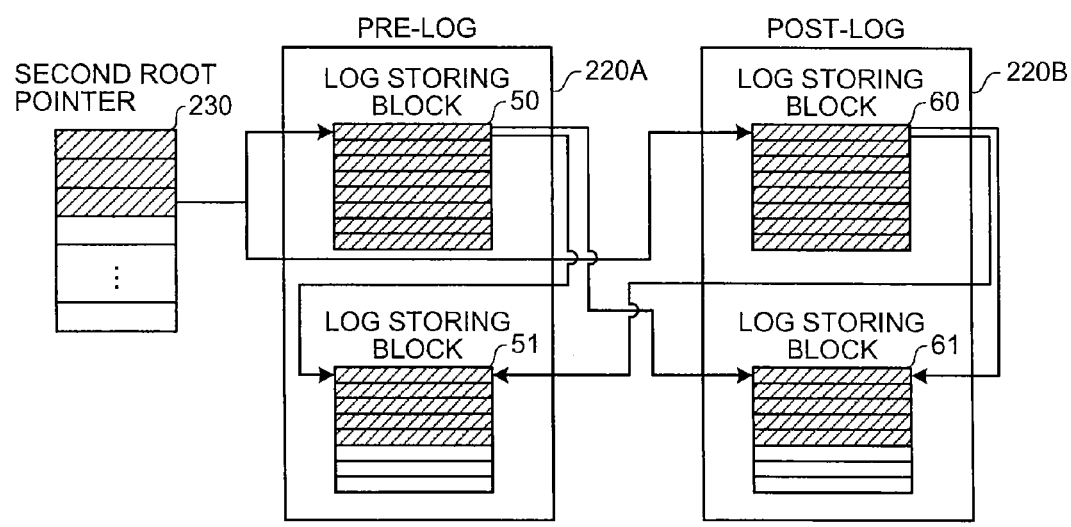
FIG. 19 is a diagram of an example of the structure of a pre-log storage area for storing a pre-log and a post-log storage area for storing a post-log according to a fourth embodiment of the present invention.

FIG. 19 is a diagram of an example of the structure of a pre-log storage area for storing a pre-log and a post-log storage area for storing a post-log according to the fourth embodiment. As in FIG. 15, among the components shown in FIG. 16, the second root pointer 230, the pre-log 220A, and the post-log 220B are shown and the other components are omitted.

As shown in FIG. 19, a pre-log storage area for storing the pre-log 220A and a post-log storage area for storing the post-log 220B have the structure same as the structure of the log storage area shown in FIG. 15 except pointers provided between the log storage areas explained below. The pre-log storage area for storing the pre-log 220A includes, for example, log storing blocks 50 and 51 as two log storing blocks. The log storing block 50 stores therein a pointer indicating the position of the log storing block 51 secured following the log storing block 50 (in the figure, an arrow indicating from a top page of the log storing block 50 to a top page of the log storing block 51). The post-log storage area for storing the post-log 220B includes, for example, log storing blocks 60 and 61 as two log storing blocks. The log storing block 60 has a pointer indicating the position of the log storing block 61 secured following the log storing block 60 (in the figure, and arrow indicating from a top page of the log storing block 60 to a top page of the log storing block 61). The second root pointer 230 indicates the top page of the log storing block 50 in the pre-log storage area and the top page of the log storing block 60 in the post-log storage area.

In FIG. 19, in addition to the structure of log chains provided in the pre-log storage area and the post-log storage area, respectively, the log storing block 50 in the pre-log storage area has a pointer indicating the position of the log storing block 61 in the post-log storage area (in the figure, an arrow indicating from the top page of the log storing block 50 to the top page of the log storing block 61). The log storing block 60 in the post-log storage area has a pointer indicating the position of the log storing block 51 in the pre-log storage area (in the figure, an arrow indicating from the top page of the log storing block 60 to the top page of the log storing block 51).

In addition to the pointer indicating the position of the log storing block 51, which is the log storing block secured next in the pre-log storage area, the log storing block 50 in the pre-log storage area has a pointer indicating the position of the log storing block secured in the post-log storage area in order same as order of securing the log storing block 51 (in this case, secured second because the log storing block 51 is secured second), i.e., the log storing block 61. Similarly, in addition to the pointer indicating the position of the log storing block 61, which is the log storing block secured next in the post-log storage area, the log storing block 60 in the post-log storage area has a pointer indicating the position of the log storing block secured in the post-log storage area in order same as order of securing the log storing block 61 (in this case, secured second because the log storing block 61 is secured second), i.e., the log storing block 61.

As explained above, because the pre-log 220A and the post-log 220B store log information of the same contents, the pre-log 220A and the post log 220B stores the same log information unless abnormality such as a short break occurs. Therefore, the log stored in the respective pages of the log storing block 50 is the same as the log stored in the corresponding pages of the log storing block 60. The log stored in the respective pages of the log storing block 51 is the same as the log stored in the corresponding pages of the log storing block 61. Therefore, the log storing block 50 in the pre-log storage area has the pointer indicating the position of the log storing block 61 in the post-log storage area in addition to the pointer indicating the position of the log storing block 51. Consequently, the log storing block 50 secures, as backup, the position of the log storing block 61 that stores log information same as that of the log storing block 51. Similarly, the log storing block 60 in the post-log storage area has the pointer indicating the position of the log storing block 51 in the pre-log storage area in addition to the pointer indicating the position of the log storing block 61. Consequently, the log storing block 60 secures, as backup, the position of the log storing block 51 that stores log information same as that of the log storing block 61. Although not shown in the figure, the log storing block 5 has a pointer indicating the position of a log storing block secured next to the log storing block 51 in the pre-log storage area and has a pointer indicating the position of a log storing block secured next to the log storing block 61 in the post-log storage area. Similarly, although not shown in the figure, the log storing block 61 has a pointer indicating the position of a log storing block secured next to the log storing block 61 in the post-log storage area and has a pointer indicating the position of a log storing block secured next to the log storing block 51 in the pre-log storage area. In FIG. 19, as an example, the logs are stored in the two log storing blocks (the log storing blocks 50 and 51 and the log storing blocks 60 and 61) in each of the pre-log storage area and the post-log storage area. However, the same holds true when logs are stored in three or more log storing blocks in each of the pre-log storage area and the post-log storage area.

As explained above, the pointer is doubled in the log storing blocks in the pre-log storage area and the post-log storage area. This makes it possible to easily perform restoration of a log even when the log is broken by a short break or the like. For example, when a short break occurs during writing in the log storing block 51 and log data in a page being written and a lower order page thereof are broken, it is possible to obtain the log from the log storing block 61 by using the pointer to the log storing block 61 of the log storing block 50. Therefore, it is possible to easily restore the log of the log storing block 51. As explained above, because the pointer is doubled, it is possible to prevent log information from being lost whichever timing a short break occurs. It is possible to easily return the memory system 10 to a state before a short break occurs by using any one of the pre-log 220A and the post-log 220B.

Fifth Embodiment

In the embodiments explained above, it is possible to multiplex and store the second root pointer and the first root pointer.

Figure 20:
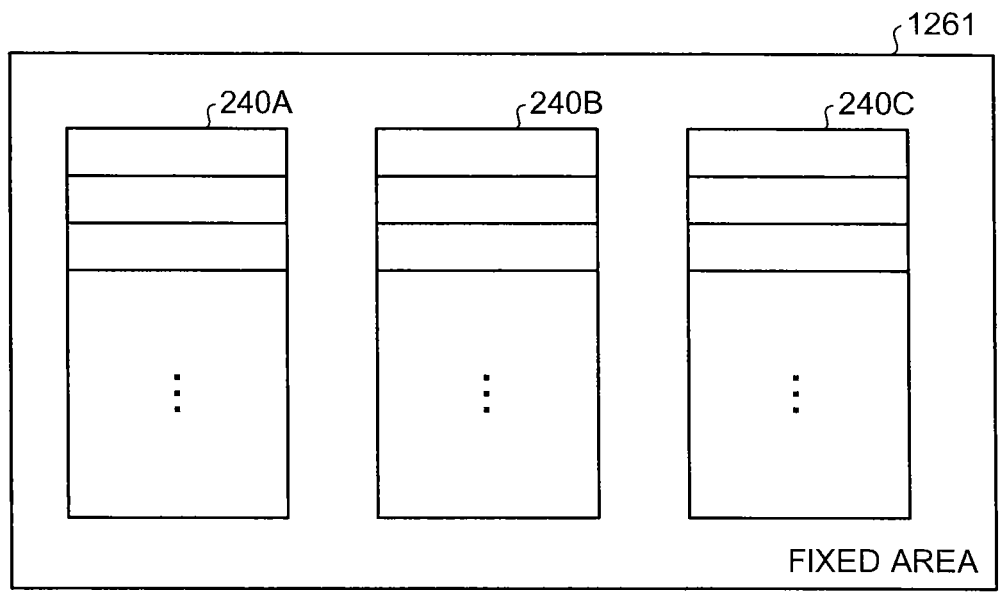
FIG. 20 is a diagram of an example of multiplexing of a first root pointer according to a fifth embodiment of the present invention.

FIG. 20 is a diagram of an example of multiplexing of the first root pointer according to a fifth embodiment of the present invention. First root pointers 240A to 240C are stored in three different blocks in the fixed area 1261 of the management information storage area of the NAND memory. In this case, when update of the first root pointers is performed, writing in the respective blocks is performed in order of 240A, 240B, and 240C. When the first root pointer storing block becomes full with data, processing for erasing this block and writing, in the erased block, the first root pointer 240 indicating the position of a new second root pointer storing block is performed. In this case, as in the case explained above, the erasing and the writing processing are performed in order block by block. When the erasing and the writing processing of the blocks are performed, by tripling the first root pointer as the first root pointers 240A to 240C, it is possible to shorten a state in which the first root pointer 240 is stored only in one block. Although the first root pointer is tripled, the first root pointer can be doubled or multiplexing equal to or larger than quadrupling can be applied to the first root pointer. It is possible to surely double the first root pointer 240 by subjecting the first root pointer 240 to multiplexing equal to or larger than quadrupling.

Figure 21:
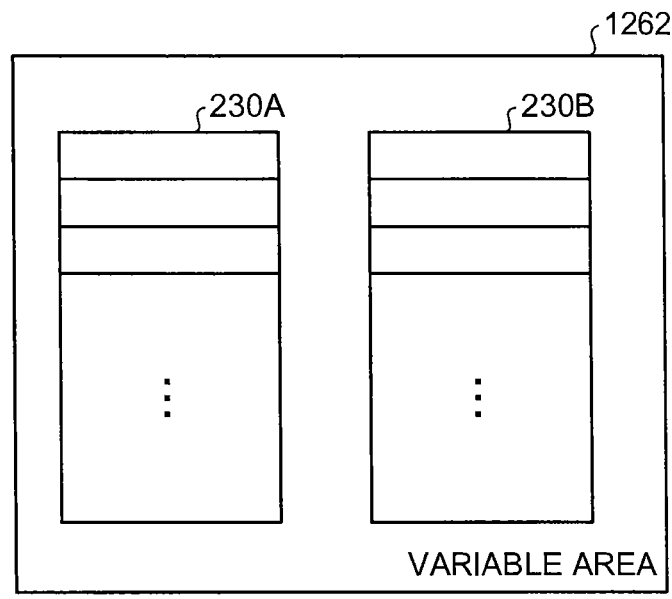
FIG. 21 is a diagram of an example of multiplexing of a second root pointer according to the fifth embodiment.

FIG. 21 is a diagram of an example of multiplexing of the second root pointer according to a fifth embodiment of the present invention. As shown in FIG. 21, second root pointers 230A and 230B are stored in two different blocks in the variable area 1262 of the management information storage area 126 of the NAND memory 12.

It is assumed that, for example, the same information is stored in the same page position in blocks that store the two second root pointers 230A and 230B. As timing for storing the second root pointers 230A and 230B, the second root pointer 230A is stored before a snapshot is stored and the second root pointer 230B are stored after the storage of the snapshot ends. By setting such a storage rule, when numbers of pages in which the second root pointers 230A and 230B are different, it is possible to determine that a short break has occurred and it is possible to perform startup processing during the short break without checking the log 220 in the NAND memory 12. The second root pointer is doubled in the above explanation. However, multiplication equal to or larger than tripling can be applied to the second root pointer.

When the second root pointer 230 is multiplexed, information indicating the positions of blocks in which the multiplexed respective second root pointers 230 are stored is stored in the first root pointer 240.

According to the fifth embodiment, because the first root pointer 240 and the second root pointer 230 are multiplexed, there is an effect that it is possible to prevent respective kinds of information from being lost.

In the above explanation, the second root pointer 230 is provided as the pointer indicating the storage positions of the snapshot 210, the pre-log 220A, and the post-log 220B and the first root pointer 240 is provided as the pointer indicating the storage position of the second root pointer 230. Therefore, the pointers are provided at two stages. However, for example, the pointers can be provided at one stage.

The top pointers of the pre-log 220A and the post-log 220B can be stored in the snapshot 210 rather than in the second root pointer storing block.

In the above explanation, the charge accumulating layer is not limited to the floating gate type and can be a charge trap type including a silicon nitride film such as the MONOS (Metal-Oxide-Nitride-Oxide-Semiconductor) structure and other systems.

As explained above, according to the present invention, there is an effect that, in a memory system having a NAND flash memory including a multi-value memory, it is possible to improve reliability of data restoration while storing management information indicating a storage position of data stored in the NAND flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A memory system comprising:
a volatile memory;
a nonvolatile memory configured to store management information including a storage position of data and pointing information indicating a storage position of the management information; and
a controller configured to read out at least one part of the management information from the nonvolatile memory into the volatile memory and to perform data management while updating the management information, wherein
the pointing information includes a second pointer indicating the storage position of the management information and a first pointer indicating a storage position of the second pointer, and
the nonvolatile memory includes:
   a snapshot storage area saving a snapshot including the management information stored in the volatile memory; and
   a log storage area saving logs indicating difference information of the management information before and after updating; and
the controller is configured to save, when a predetermined condition is satisfied, the snapshot or the logs in the snapshot storage area or the log storage area, and to update the first pointer when the second pointer is updated multiple times.

2. A method of controlling a memory system comprising:
storing management information including a storage position of data and pointing information in a nonvolatile memory;
reading out at least one part of the management information from the nonvolatile memory into a volatile memory and performing data management while updating the management information;
incorporating a second pointer indicating the storage position of the management information and a first pointer indicating a storage position of the second pointer into the pointing information;
storing the first pointer and the second pointer in the nonvolatile memory;
saving a snapshot including the management information stored in the volatile memory into the nonvolatile memory; and
saving logs indicating a difference information of the management information before and after updating into the nonvolatile memory; wherein
the saving is executed when a predetermined condition is satisfied, and
the first pointer is updated once when the second pointer is updated multiple times.

3. The method according to claim 2, further comprising:
saving, when the predetermined condition is satisfied, the management information stored in the volatile memory into the nonvolatile memory and updating the second pointer.

4. The method according to claim 2, further comprising, when reading out the management information into the volatile memory:
reading the first pointer and acquiring the storage position of the second pointer; and
after reading the first pointer, reading the second pointer and acquiring the storage position of the management information.

5. The method according to claim 2, wherein
in the saving the snapshot, the snapshot is saved into a snapshot storage area of the nonvolatile memory,
in the saving the logs, the logs are saved into a log storage area of the nonvolatile memory, and
in the saving the snapshot, the snapshot in the snapshot storage area is saved when the log storage area is full with the logs.

6. The method according to claim 2, wherein
the nonvolatile memory includes a plurality of blocks, each of the plurality of blocks is a data erasing unit and includes a plurality of pages, each of the plurality of pages is a data programming unit, and
the first pointer is stored in a first block selected from the plurality of blocks and the second pointer is stored in a second block selected from the plurality of blocks; and further comprising:
when all of the plurality of pages in the second block are full with the second pointer, acquiring a third block for writing the second pointer and writing a new version of the first pointer in a new page of the first block.

7. The method according to claim 2, further comprising:
multiplexing the first pointer in a fixed area whose storage position in the nonvolatile memory is fixed.

8. The method according to claim 2, further comprising:
multiplexing the second pointer in a variable area whose storage position in the nonvolatile memory is variable.

9. The method according to claim 2, wherein the nonvolatile memory is capable of storing multiple bits in one memory cell.

10. A memory system comprising:
a controller configured to manage data; and
a nonvolatile memory configured to store management information and pointing information; wherein
the pointing information includes a second pointer indicating a storage position of the management information and a first pointer indicating a storage position of the second pointer,
the controller is configured to save at least a log or a snapshot, the snapshot includes the management information; and the log indicates a difference of the management information before and after updating, and to update the first pointer when the second pointer is updated multiple times.

11. The memory system according to claim 10, further comprising:
a volatile memory; and
a controller configured to read out at least one part of the management information from the nonvolatile memory into the volatile memory and to perform data management while updating the management information, wherein
the controller is configured to save, when the predetermined condition is satisfied, the management information stored in the volatile memory into the nonvolatile memory and to update the second pointer.

12. The memory system according to claim 11, wherein when reading out the management information into the volatile memory, the controller is configured to:
read the first pointer and acquire the storage position of the second pointer; and after reading the first pointer, read the second pointer and acquire the storage position of the management information.

13. The memory system according to claim 10, wherein
the first pointer is stored in a fixed area whose storage position in the nonvolatile memory is fixed and the second pointer is stored in a variable area whose storage position in the nonvolatile memory is variable; and
the second pointer is more frequently updated than the first pointer.

14. The memory system according to claim 13, wherein the first pointer is multiplexed in the fixed area.

15. The memory system according to claim 13, wherein the second pointer is multiplexed in the variable area.

16. The memory system according to claim 10, wherein the controller is configured to save the snapshot in a snapshot storage area when a log storage area is full with the logs.

17. The memory system according to claim 10, wherein
the nonvolatile memory includes a plurality of blocks, each of the plurality of blocks is a data erasing unit and includes a plurality of pages, each of the plurality of pages is a data programming unit,
the first pointer is stored in a first block selected from the plurality of blocks and the second pointer is stored in a second block selected from the plurality of blocks, and
when all of the plurality of pages in the second block are full with the second pointer, the controller is configured to acquire a third block for writing the second pointer and to write a new version of the first pointer in a new page of the first block.

18. The memory system according to claim 10, wherein the nonvolatile memory is capable of storing multiple bits in one memory cell.

* * * * *